United States Patent
Suich et al.

(10) Patent No.: US 11,876,155 B2
(45) Date of Patent: Jan. 16, 2024

(54) BROAD ELECTROMAGNETIC SPECTRUM LIGHT-EMITTING DIODE PACKAGES

(71) Applicant: CreeLED, Inc., Durham, NC (US)

(72) Inventors: David Suich, Durham, NC (US); Michael Check, Holly Springs, NC (US); Colin Blakely, Raleigh, NC (US)

(73) Assignee: CreeLED, Inc., Durham, NC (US)

( * ) Notice: Subject to any disclaimer, the term of this patent is extended or adjusted under 35 U.S.C. 154(b) by 177 days.

(21) Appl. No.: 17/496,320

(22) Filed: Oct. 7, 2021

(65) Prior Publication Data

US 2023/0115342 A1 Apr. 13, 2023

(51) Int. Cl.
*H01L 33/50* (2010.01)
*H01L 33/58* (2010.01)
(Continued)

(52) U.S. Cl.
CPC .......... *H01L 33/504* (2013.01); *F21V 23/005* (2013.01); *H01L 25/0753* (2013.01);
(Continued)

(58) Field of Classification Search
CPC ....... H01L 33/504; H01L 33/54; H01L 33/58; H01L 25/0753; F21V 23/005; F21Y 2105/16; F21Y 2113/13; F21Y 2115/10
See application file for complete search history.

(56) References Cited

U.S. PATENT DOCUMENTS

| 2009/0296384 A1* | 12/2009 | Van De Ven | F21K 9/232 |
| | | | 362/231 |
| 2020/0161510 A1* | 5/2020 | Jung | H01L 33/58 |
| 2020/0267814 A1* | 8/2020 | Song | H05B 45/20 |

FOREIGN PATENT DOCUMENTS

| CN | 1790708 A | * 6/2006 | ............... F21K 9/00 |
| CN | 103090222 A | * 5/2013 | ............... F21K 9/60 |
| CN | 110408393 A | * 11/2019 | ............. C09K 11/08 |

OTHER PUBLICATIONS

Author Unknown, "4-Wavelength High-Power LED Source," Product Specification Page, Thor Labs, thorlabs.com/newgrouppage9.cfm?objectgroup_id=3836, accessed at least as early as Apr. 8, 2021, 18 pages.

(Continued)

Primary Examiner — Mary Ellen Bowman
(74) Attorney, Agent, or Firm — Withrow & Terranova, P.L.L.C.

(57) ABSTRACT

Light-emitting diode (LED) packages, and more particularly broad electromagnetic spectrum LED packages are disclosed. Individual LED packages are disclosed that are capable of emitting various combinations of peak wavelengths across a broad electromagnetic spectrum, including one or more combinations of ultraviolet, visible, and infrared peak wavelengths. Such LED packages may also be broadly tunable across portions of the electromagnetic spectrum ranging from ultraviolet to infrared wavelengths. By providing such capabilities within a single light source provided by a single LED package, larger and more complex systems for broadband emissions that include multiple light sources, complex optical systems, mirrors, filters, and additional components may be avoided. LED chip arrangements, control schemes, and encapsulant arrangements are also disclosed for such broad electromagnetic spectrum LED packages.

29 Claims, 11 Drawing Sheets

(51) Int. Cl.
*H01L 33/54* (2010.01)
*F21V 23/00* (2015.01)
*H01L 25/075* (2006.01)
*F21Y 113/13* (2016.01)
*F21Y 105/16* (2016.01)
*F21Y 115/10* (2016.01)

(52) U.S. Cl.
CPC ............ *H01L 33/54* (2013.01); *H01L 33/58* (2013.01); *F21Y 2105/16* (2016.08); *F21Y 2113/13* (2016.08); *F21Y 2115/10* (2016.08)

(56) References Cited

OTHER PUBLICATIONS

Monteiro, et al., "Constellation Design for Color-Shift Keying Using Interior Point Methods," IEEE Workshop on Optical Wireless Communications, 2012, pp. 1224-1228.

\* cited by examiner

Zone 1

Zone

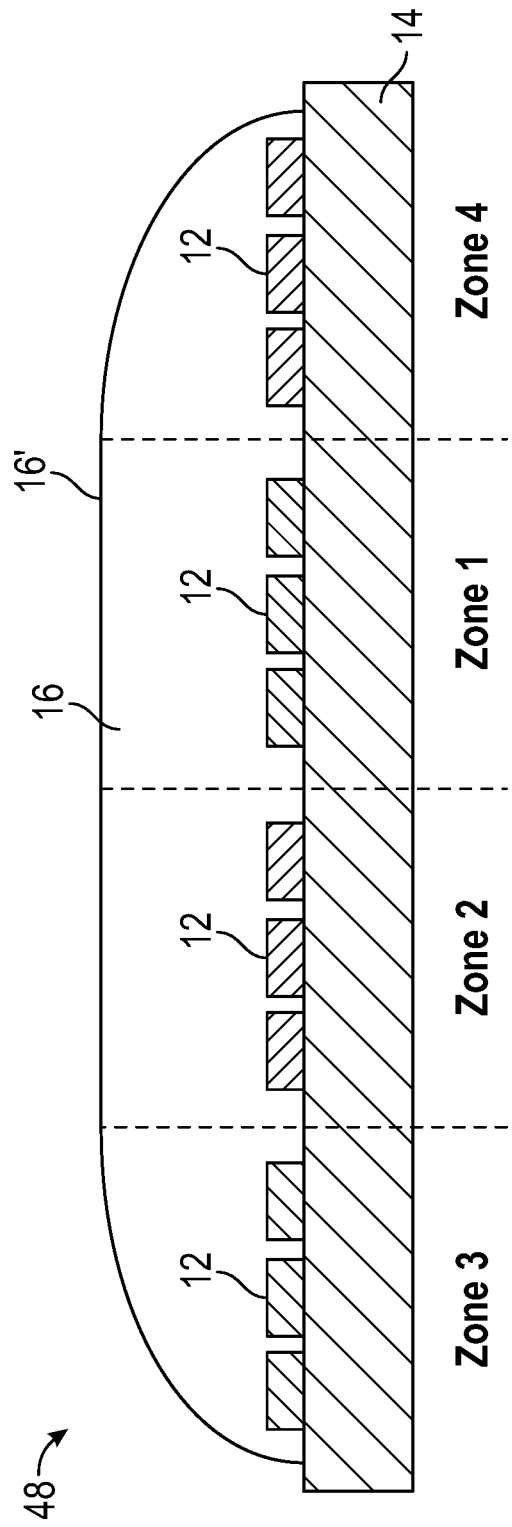
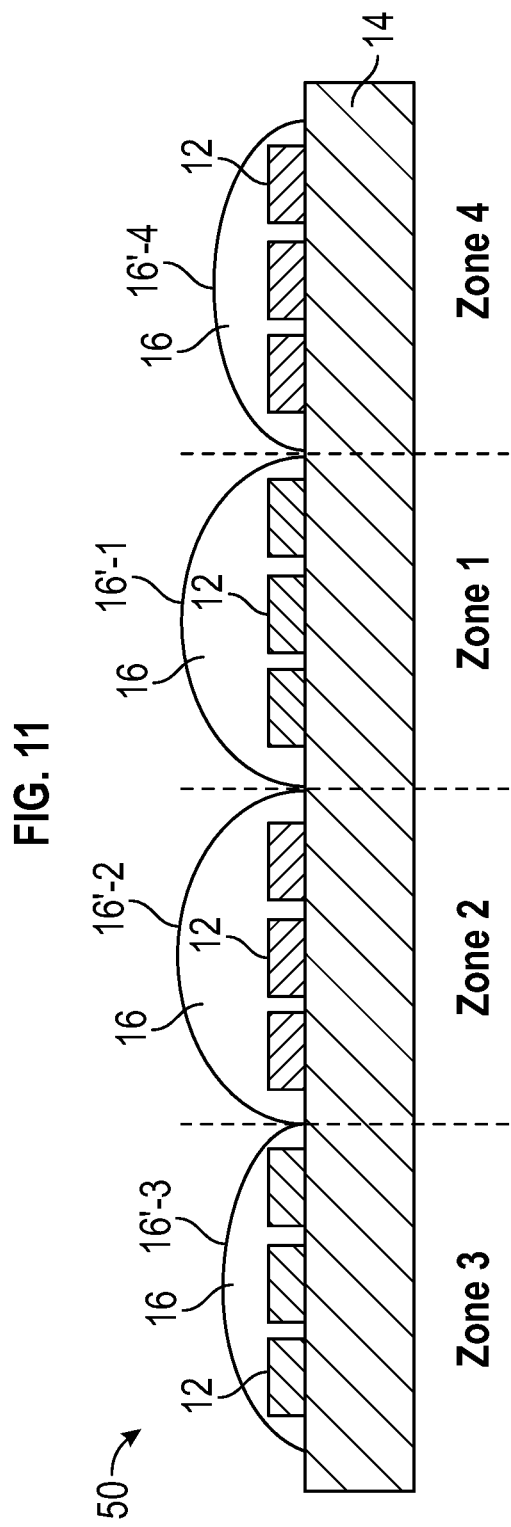

BROAD ELECTROMAGNETIC SPECTRUM LIGHT-EMITTING DIODE PACKAGES

FIELD OF THE DISCLOSURE

The present disclosure relates to light-emitting diode packages, and more particularly to broad electromagnetic spectrum light-emitting diode packages.

BACKGROUND

Solid-state lighting devices such as light-emitting diodes (LEDs) are increasingly used in both consumer and commercial applications. Advancements in LED technology have resulted in highly efficient and mechanically robust light sources with a long service life. Accordingly, modern LEDs have been widely adopted in various illumination contexts, for backlighting of liquid crystal display (LCD) systems (e.g., as a substitute for cold cathode fluorescent lamps), and for direct-view LED displays. Applications utilizing LED arrays further include vehicular headlamps, roadway illumination, light fixtures, and various indoor, outdoor, and specialty contexts. Desirable characteristics of LED devices include high luminous efficacy, long lifetime, and color gamut.

LEDs convert electrical energy to light and generally include one or more active layers of semiconductor material (or an active region) arranged between oppositely doped n-type and p-type layers. When a bias is applied across the doped layers, holes and electrons are injected into the one or more active layers where they recombine to generate emissions such as visible light or ultraviolet emissions. An LED chip typically includes an active region that may be fabricated, for example, from silicon carbide, gallium nitride, gallium phosphide, aluminum nitride, gallium arsenide-based materials, and/or from organic semiconductor materials. Photons generated by the active region are initiated in all directions.

Typically, it is desirable to operate LEDs at the highest light emission efficiency possible, which can be measured by the emission intensity in relation to the output power (e.g., in lumens per watt). A practical goal to enhance emission efficiency is to maximize extraction of light in the direction of the desired transmission of light. Light extraction and external quantum efficiency of an LED can be limited by a number of factors, including internal reflection and/or absorption. LED packages have been developed that can provide mechanical support, electrical connections, and encapsulation for LED emitters. Light emissions that exit surfaces of LED emitters may then interact with elements or surfaces of corresponding LED packages, thereby increasing opportunities for reflections and/or light loss. Multiple color LED packages have been developed that include different colored LED chips arranged within a same package structure. In certain applications, the different colored LED chips can be arranged in close proximity to one another on a common submount, which can add complexity for corresponding electrical controls and color mixing. As LED applications continue to advance, challenges exist in producing high quality light with desired emission characteristics while also providing high light emission efficiency.

The art continues to seek improved LEDs and solid-state lighting devices having desirable illumination characteristics capable of overcoming challenges associated with conventional lighting devices.

SUMMARY

The present disclosure relates to light-emitting diode (LED) packages, and more particularly to broad electromagnetic spectrum LED packages. Individual LED packages are disclosed that are capable of emitting various combinations of peak wavelengths across a broad electromagnetic spectrum, including one or more combinations of ultraviolet, visible, and infrared peak wavelengths. Such LED packages may also be broadly tunable across portions of the electromagnetic spectrum ranging from ultraviolet to infrared wavelengths. By providing such capabilities within a single light source provided by a single LED package, larger and more complex systems for broadband emissions that include multiple light sources, complex optical systems, mirrors, filters, and additional components may be avoided. LED chip arrangements, control schemes, and encapsulant arrangements are also disclosed for such broad electromagnetic spectrum LED packages.

In one aspect, an LED package comprises: a submount; a plurality of LED chips on the submount, wherein the plurality of LED chips are configured to provide a plurality of peak wavelengths that include at least a first peak wavelength in a range from 100 nanometers (nm) to 400 nm, a second peak wavelength in a range from 400 nm to 750 nm, and a third peak wavelength in a range from 750 nm to 1100 nm; and an encapsulant that covers the plurality of LED chips and portions of the submount that are adjacent the plurality of LED chips. In certain embodiments, the plurality of LED chips comprise from 10 to 20 LED chips that are each configured to emit a different peak wavelength of the plurality of peak wavelengths. In certain embodiments, the peak wavelengths of the 10 to 20 LED chips differ from one another by at least 10 nm. In certain embodiments, the encapsulant forms a single lens that covers the plurality of LED chips on the submount.

In certain embodiments for the LED package, the plurality of LED chips are arranged in a plurality of zones on the submount; and each zone is defined by a subgroup of the plurality of LED chips such that a forward turn-on voltage for each LED chip in the zone does not exceed a maximum forward voltage rating for any other LED chip in the zone. In certain embodiments, the maximum forward voltage rating in a first zone of the plurality of zones differs from the maximum forward voltage rating in a second zone of the plurality of zones in a range from 0.5 V to 1.5 V. In certain embodiments, each zone of the plurality of zones is spatially separated from other zones of the plurality of zones across a surface of the submount. In certain embodiments, each zone of the plurality of zones is interspersed with at least one other zone of the plurality of zones across a surface of the submount.

In certain embodiments for the LED package, a first zone of the plurality of zones is defined by a first subgroup of the plurality of LED chips having a first maximum forward voltage rating; a second zone of the plurality of zones is defined by a second subgroup of the plurality of LED chips having a second maximum forward voltage rating; a third zone of the plurality of zones is defined by a third subgroup of the plurality of LED chips having a third maximum forward voltage rating; and a fourth zone of the plurality of zones is defined by a fourth subgroup of the plurality of LED chips having a fourth maximum forward voltage rating. In certain embodiments for the LED package, the first maximum forward voltage rating and the second maximum forward voltage rating are within 0.5 V of one another; the third maximum forward voltage rating and the fourth maximum forward voltage rating are within 0.5 V of one another; and the first maximum forward voltage rating differs from the third maximum forward voltage rating in a range from 0.5 V to 1.5 V.

In certain embodiments for the LED package, at least one zone of the plurality of zones comprises: a first serial string of LED chips that are configured to emit a first peak wavelength; a second serial string of LED chips that are configured to emit a second peak wavelength; a third serial string of LED chips that are configured to emit a third peak wavelength; and a fourth serial string of LED chips that are configured to emit a fourth peak wavelength, wherein the first peak wavelength, the second peak wavelength, the third peak wavelength, and the fourth peak wavelength differ from one another by at least 10 nm. In certain embodiments for the LED package, a common ground connection is electrically connected to each of the first serial string, the second serial string, the third serial string, and the fourth serial string.

In certain embodiments for the LED package, a first zone of the plurality of zones is arranged such that each LED chip within the first zone is capable of being electrically activated and deactivated independently from other LED chips within the first zone. In certain embodiments for the LED package, a second zone of the plurality of zones is arranged with serial strings of the LED chips within the second zone. In certain embodiments for the LED package, at least one zone of the plurality of zones comprises: a first serial string of LED chips; and a shunt device that is arranged between each LED chip of the first serial string of LED chips. In certain embodiments for the LED package, the plurality of zones comprise at least a first zone and a second zone, wherein the second zone is arranged to laterally surround a perimeter of the first zone. In certain embodiments for the LED package, the submount comprises an application-specific integrated circuit (ASIC) that is configured to provide control signals to the plurality of LED chips. In certain embodiments for the LED package, the submount comprises a multiple layer ceramic substrate that includes alternating layers of patterned metal traces and dielectric layers. In certain embodiments for the LED package, the encapsulant forms a separate lens for each LED chip of the plurality of LED chips on the submount.

In another aspect, an LED package comprises: a submount; a plurality of LED chips that are arranged in at least a first zone and a second zone on the submount, wherein: the first zone is defined by a first subgroup of LED chips of the plurality of LED chips such that the first subgroup of LED chips has a first maximum forward voltage rating; and the second zone is defined by a second subgroup of LED chips of the plurality of LED chips such that the second subgroup of LED chips has a second maximum forward voltage rating that is different than the first maximum forward voltage rating; a first encapsulant that covers at least one LED chip of the first subgroup of LED chips in the first zone; and a second encapsulant that covers at least one LED chip of the second subgroup of LED chips in the second zone, wherein the second encapsulant comprises a different material than the first encapsulant. In certain embodiments, the first subgroup of LED chips is configured to emit one or more peak wavelengths in a range from 400 nm to 750 nm, and the second subgroup of LED chips is configured to emit one or more peak wavelengths in at least one of a range from 100 mm to 400 nm and a range from 750 nm to 1100 nm. In certain embodiments, the first encapsulant comprise a higher transmissivity to light in the range from 400 nm to 750 nm than at least one of the range from 100 mm to 400 nm and the range from 750 nm to 1100 nm. In certain embodiments, the plurality of LED chips are further arranged in at least a third zone and a fourth zone, wherein: the third zone is defined by a third subgroup of LED chips of the plurality of LED chips such that the third subgroup of LED chips has a third maximum forward voltage rating; and the fourth zone is defined by a fourth subgroup of LED chips of the plurality of LED chips such that the fourth subgroup of LED chips has a fourth maximum forward voltage rating. The LED package may further comprise: a third encapsulant that covers at least one LED chip of the third subgroup of LED chips in the third zone; and a fourth encapsulant that covers at least one LED chip of the fourth subgroup of LED chips in the fourth zone, wherein at least one of the third encapsulant and the fourth encapsulant comprises a different material than the first encapsulant In certain embodiments, the first encapsulant, the second encapsulant, the third encapsulant, and the fourth encapsulant are arranged to collectively form an overall lens that covers the plurality of LED chips. In certain embodiments, each of the first encapsulant, the second encapsulant, the third encapsulant, and the fourth encapsulant forms a separate lens. In certain embodiments, at least one LED chip of the third subgroup of LED chips in the third zone is devoid of a lens.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

Figure 1A:
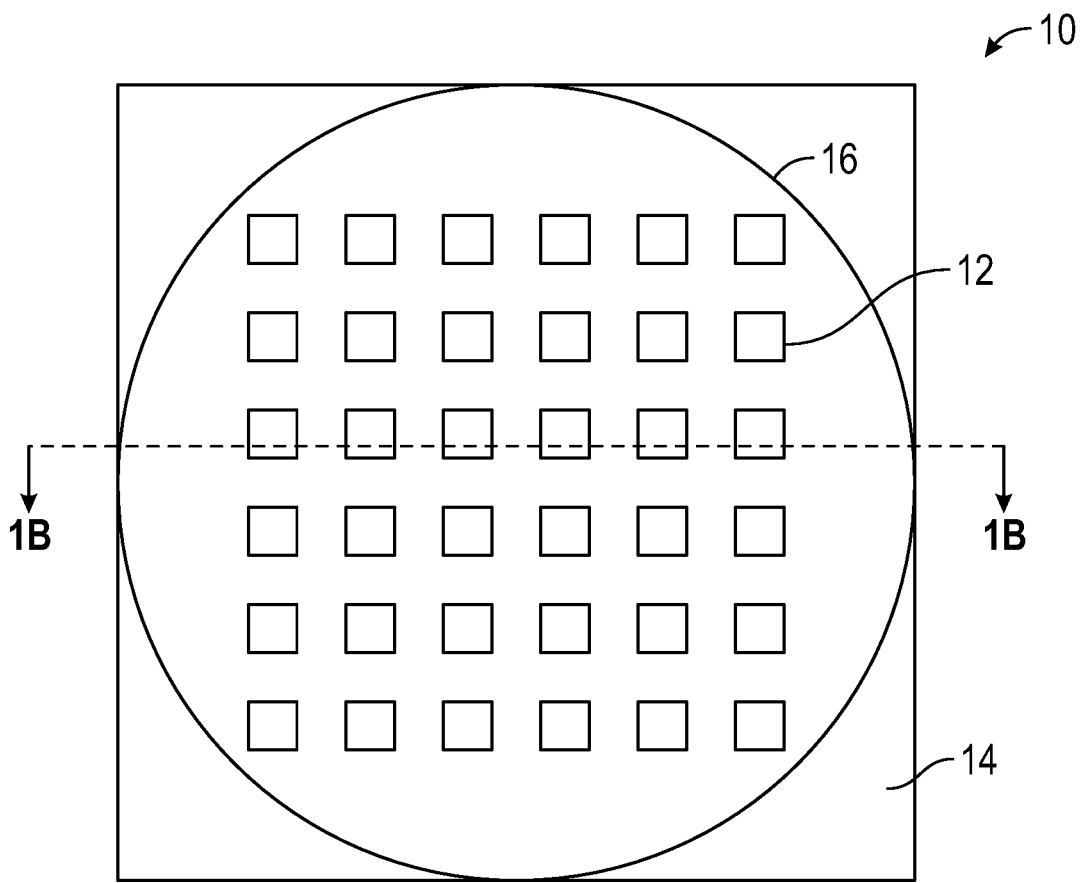
FIG. 1A is a top view of an exemplary light-emitting diode (LED) package that is configured to provide broadband electromagnetic spectral emissions from ultraviolet (UV) to infrared (IR) wavelengths and various combinations of peak wavelengths thereof according to principles of the present disclosure.
Figure 1B:
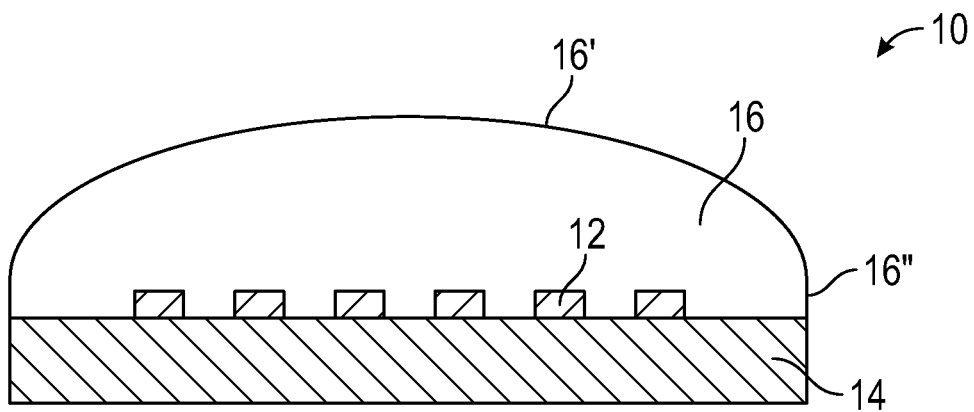
FIG. 1B is a cross-sectional view of the LED package of FIG. 1A taken along the sectional line 1B-1B of FIG. 1A.
Figure 1C:
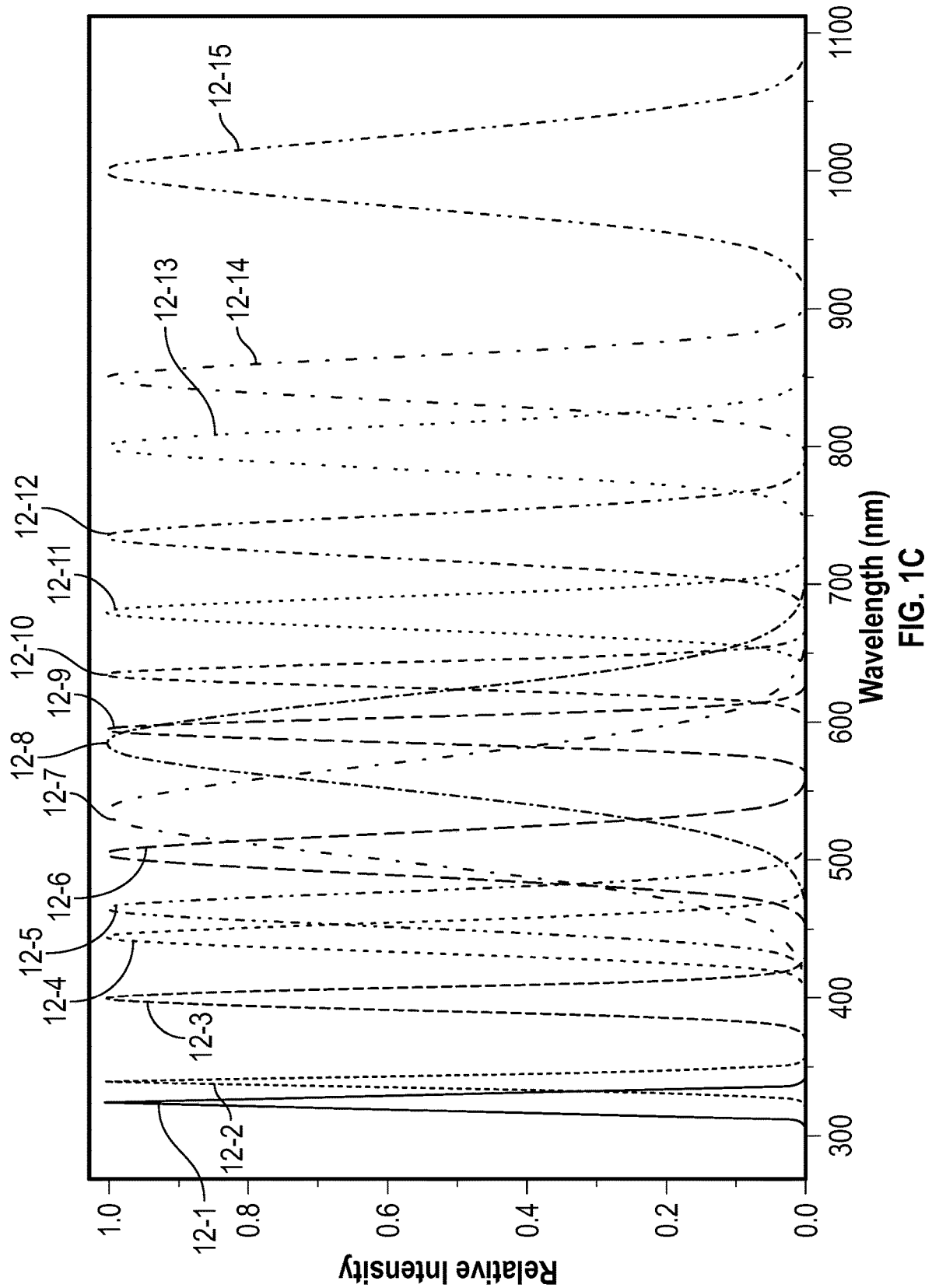

FIG. 1C a spectral emission plot indicating various peak wavelengths that may be emitted by LED chips in the LED package of FIGS. 1A and 1B.

Figure 2:
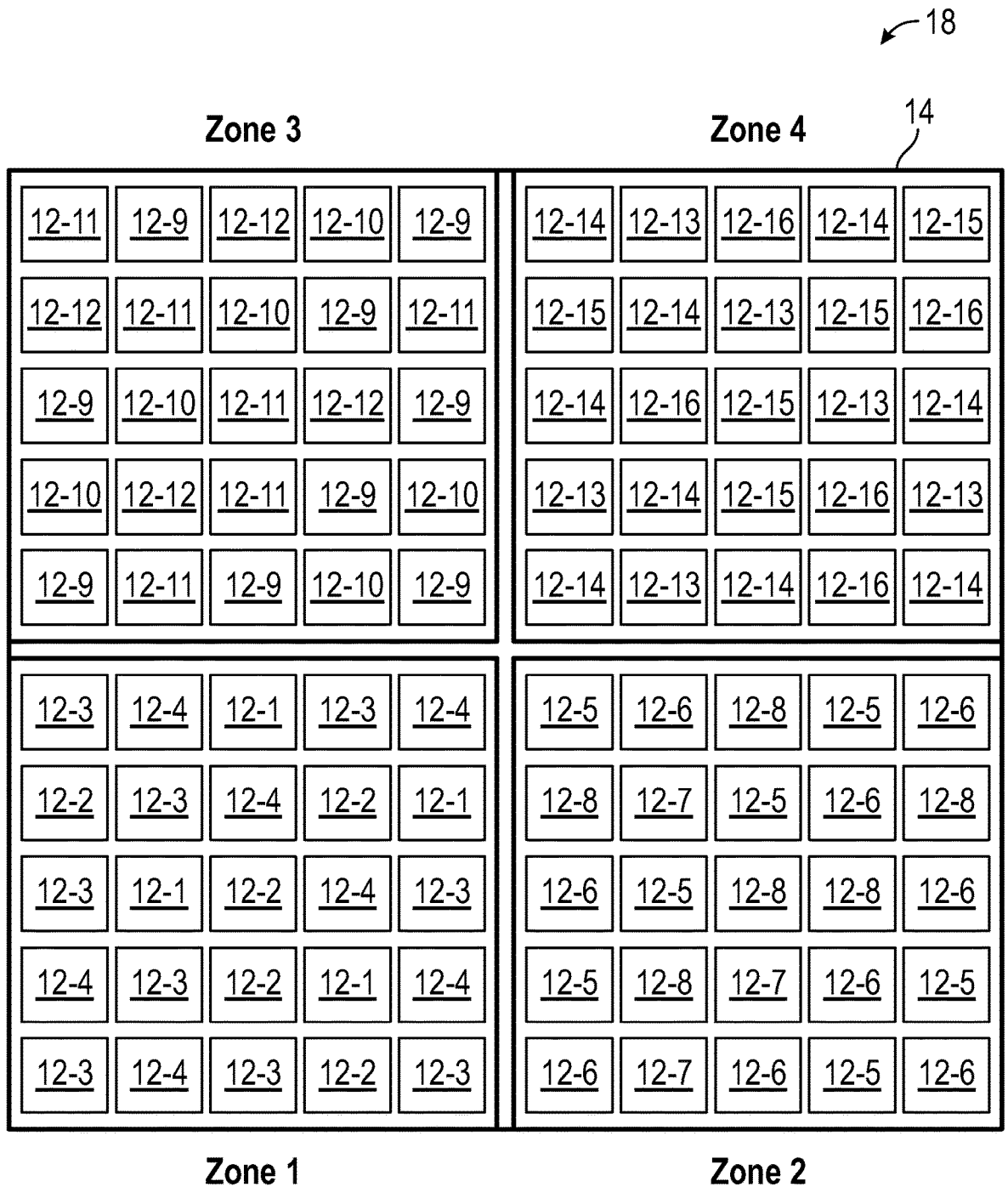

FIG. 2 is a top view of a portion of an LED package that is similar to the LED package described above for FIGS. 1A-1C, and further includes a specific arrangement of LED chips based on different material types, peak wavelengths, and/or forward voltage values.

Figure 3:
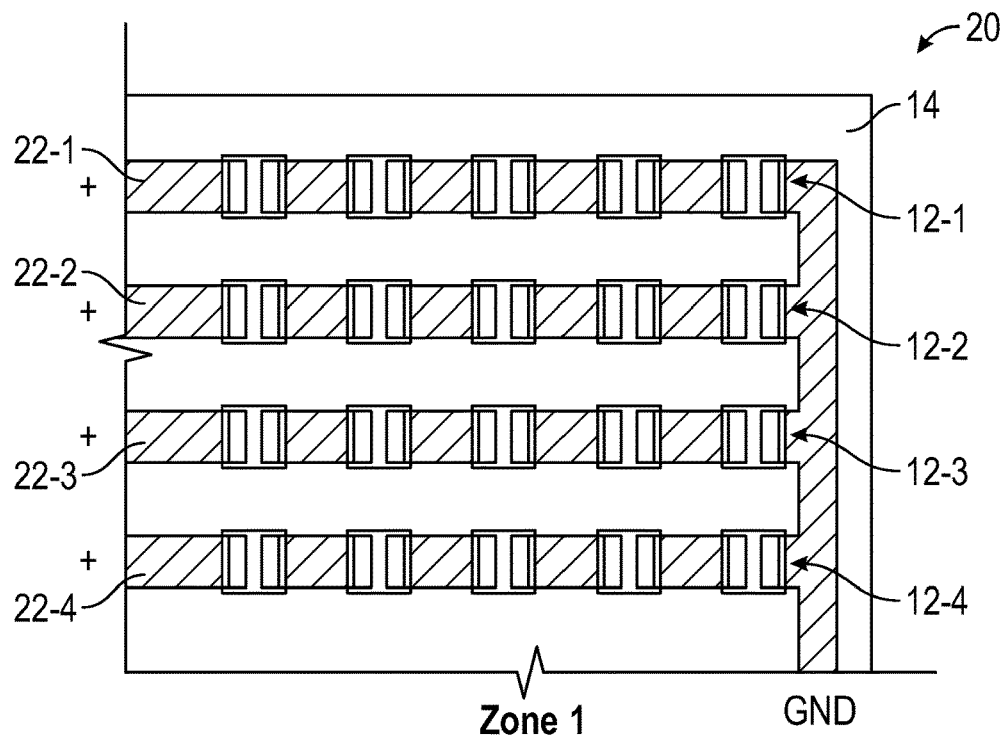

FIG. 3 is a top view of a portion of an LED package that is similar to the LED package of FIG. 2 and illustrates a connection scheme where similar colored LED chips within a zone are arranged in different serial strings that are coupled to a common ground connection.

Figure 4:
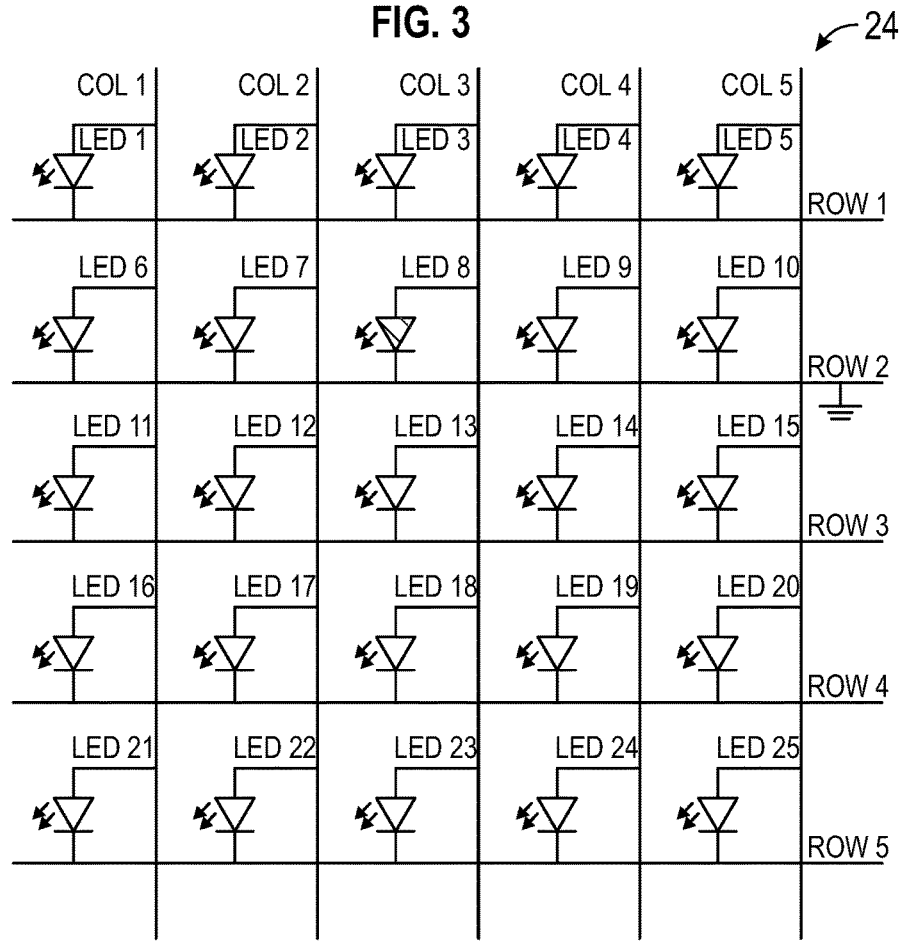

FIG. 4 is a top view of a portion of an LED package that is similar to the LED package of FIG. 2 and illustrates another connection scheme that allows multiplexing of each individual LED chip within a zone.

Figure 5A:
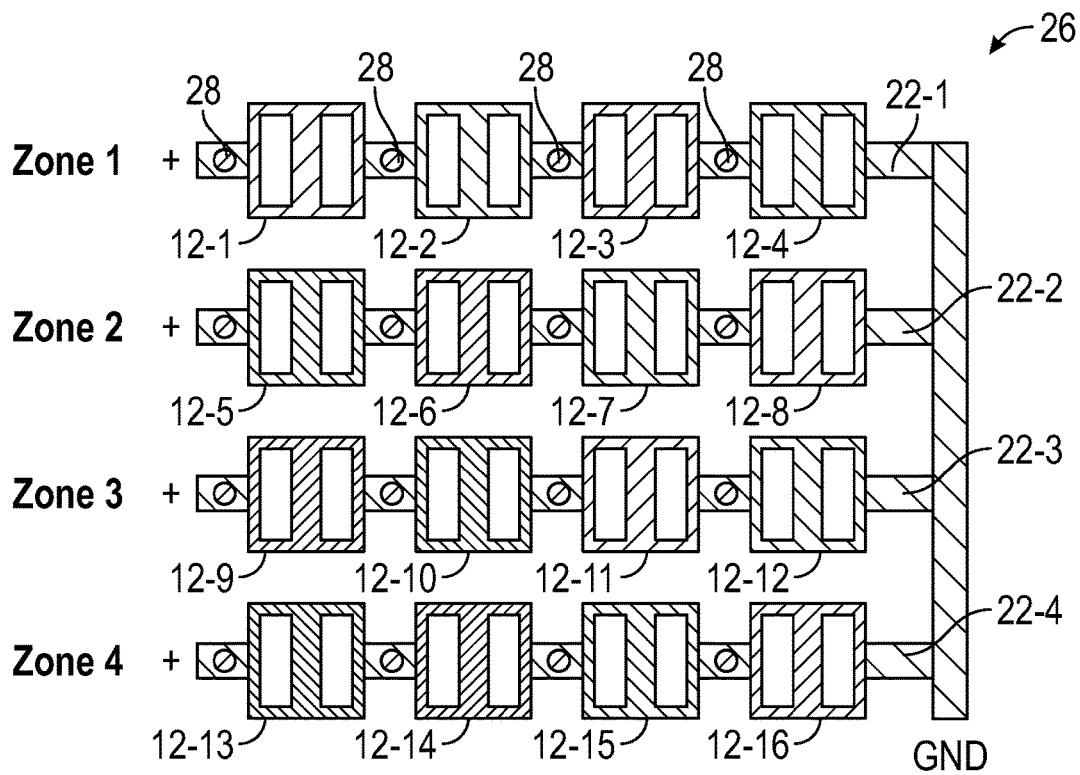

FIG. 5A is a top view of a portion of an LED package that is similar to the LED package of FIG. 2 and illustrates another connection scheme where LED chips within a particular zone are arranged in at least one serial string and shunt paths are arranged to allow individual electrical control of each LED chip within each serial string.

Figure 5B:
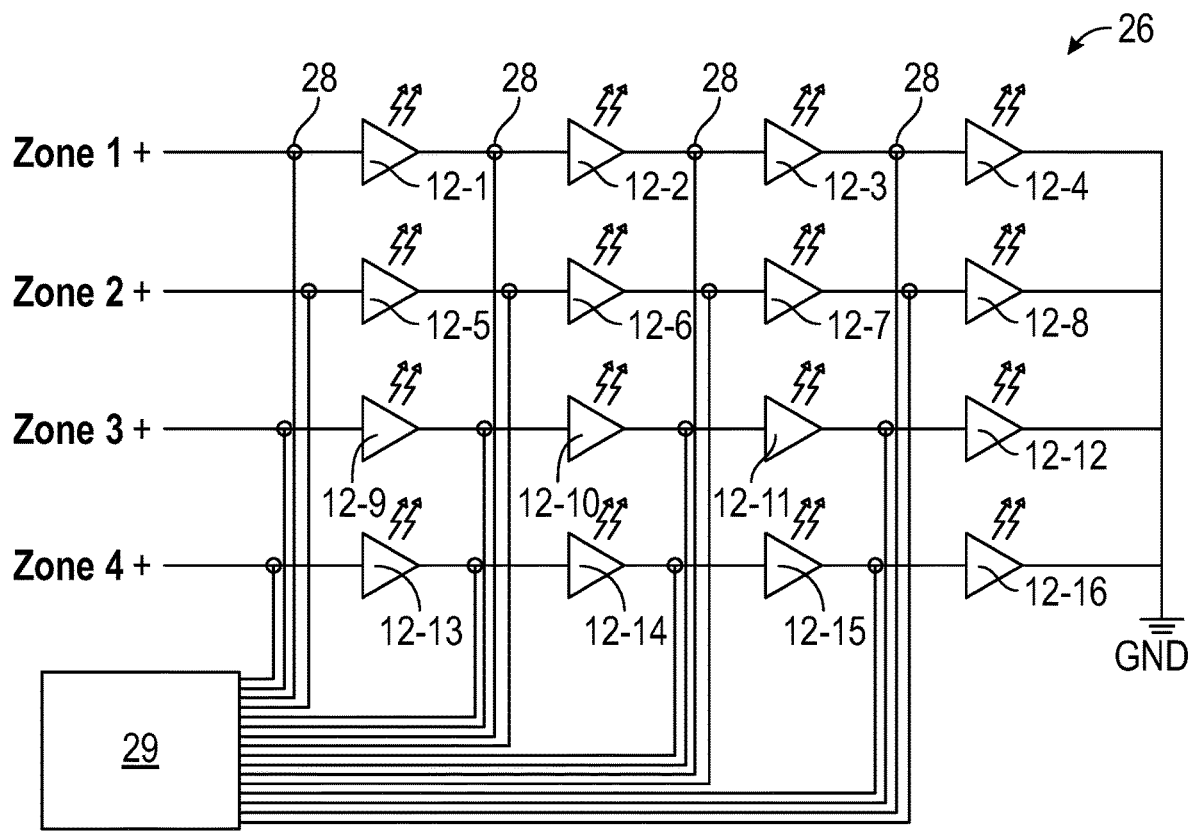

FIG. 5B is a general circuit diagram representing the electrical connection scheme of the LED package of FIG. 5A.

Figure 6:
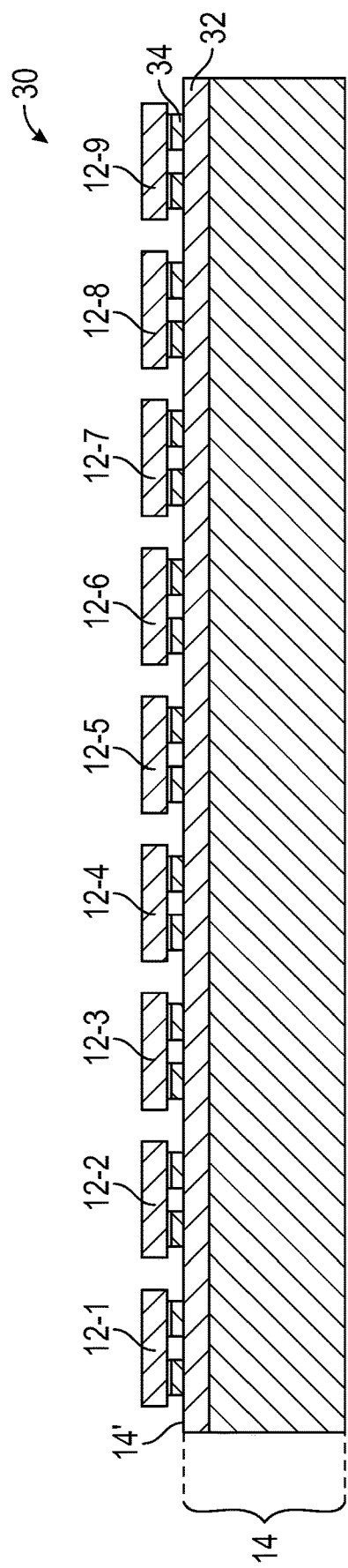

FIG. 6 is a cross-sectional view of an LED package that is similar to the LED package of FIG. 2 and illustrates another connection scheme that includes control circuitry that is integrated with the submount.

Figure 7:
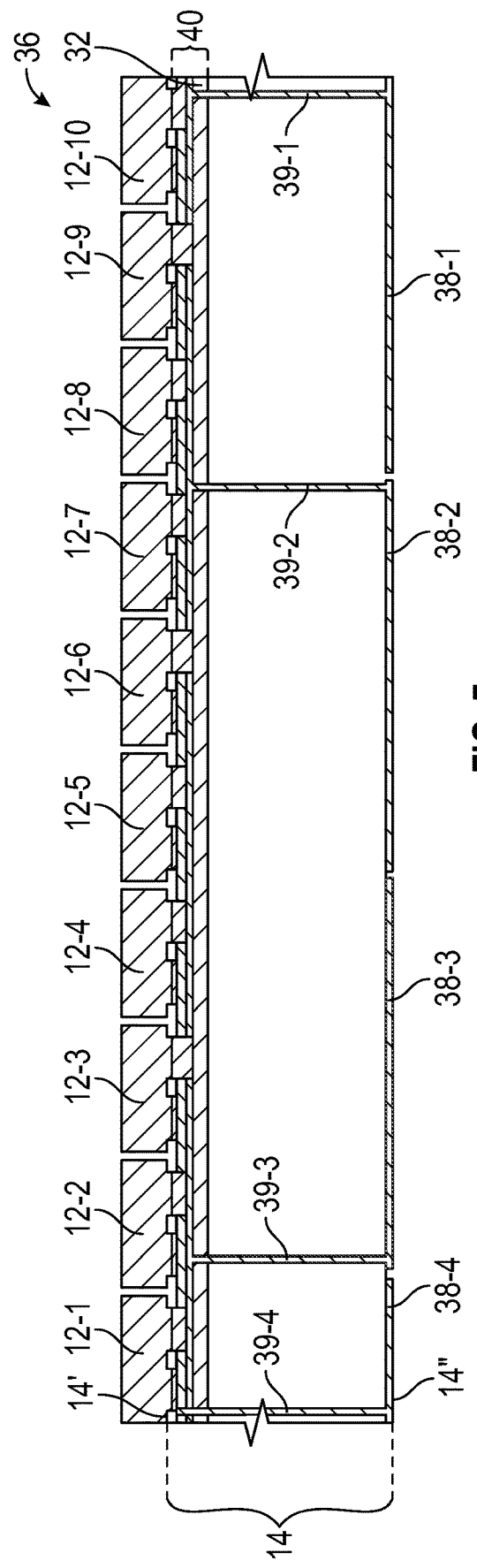

FIG. 7 is a cross-sectional view of an LED package that is similar to the LED package of FIG. 6 and further illustrates contact pads that are provided on a second face of the submount, opposite the first face.

Figure 8A:
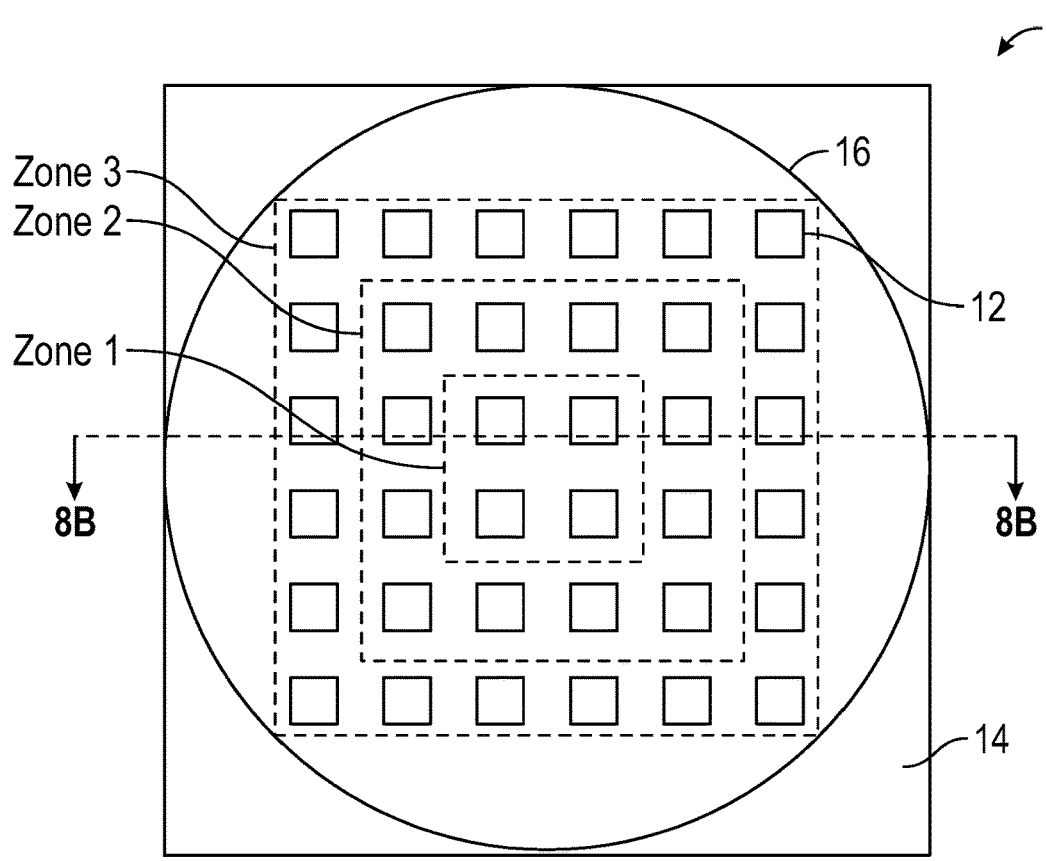

FIG. 8A is a top view of an LED package that is similar to the LED package of FIG. 2 and illustrates an alternative layout for the zones of differently grouped LED chips.

Figure 8B:
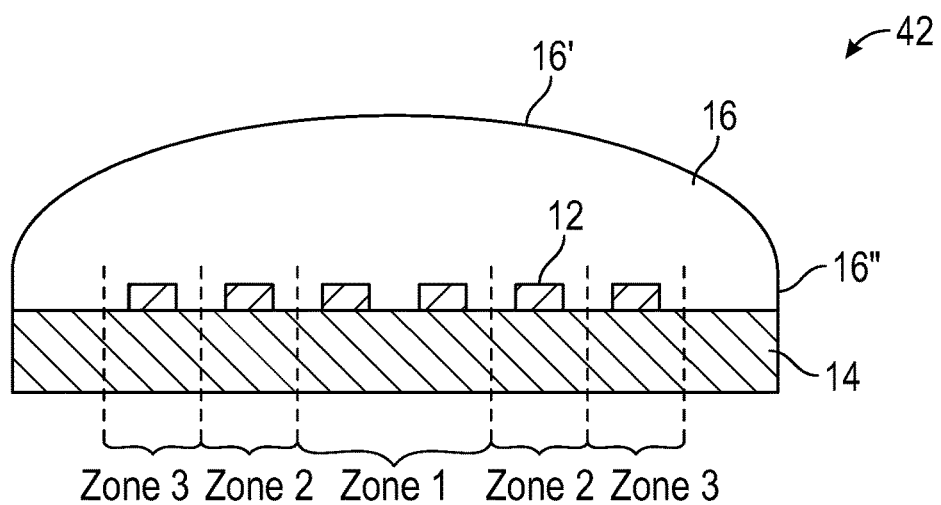

FIG. 8B is a cross-sectional view of the LED package of FIG. 8A taken along the sectional line 8B-8B of FIG. 8A.

Figure 9:
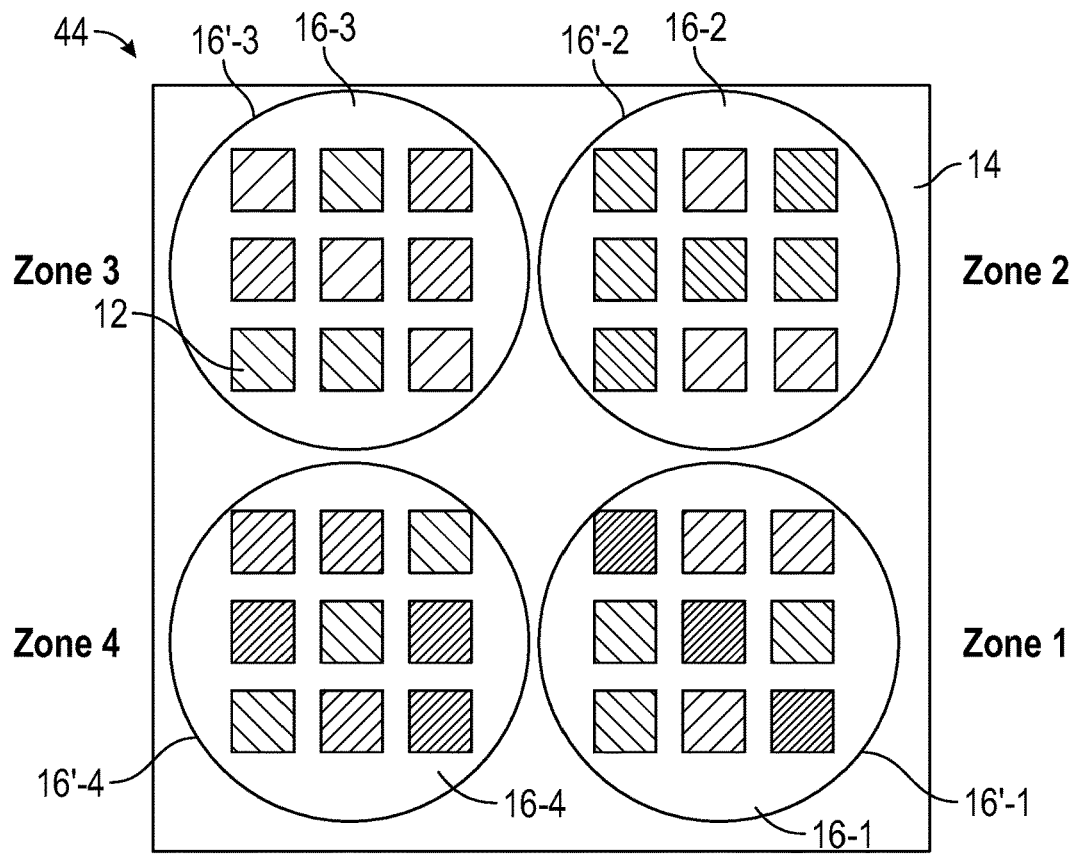

FIG. 9 is a top view of an LED package that is similar to the LED package of FIG. 2 but includes a separate lens for each of the zones.

Figure 10:
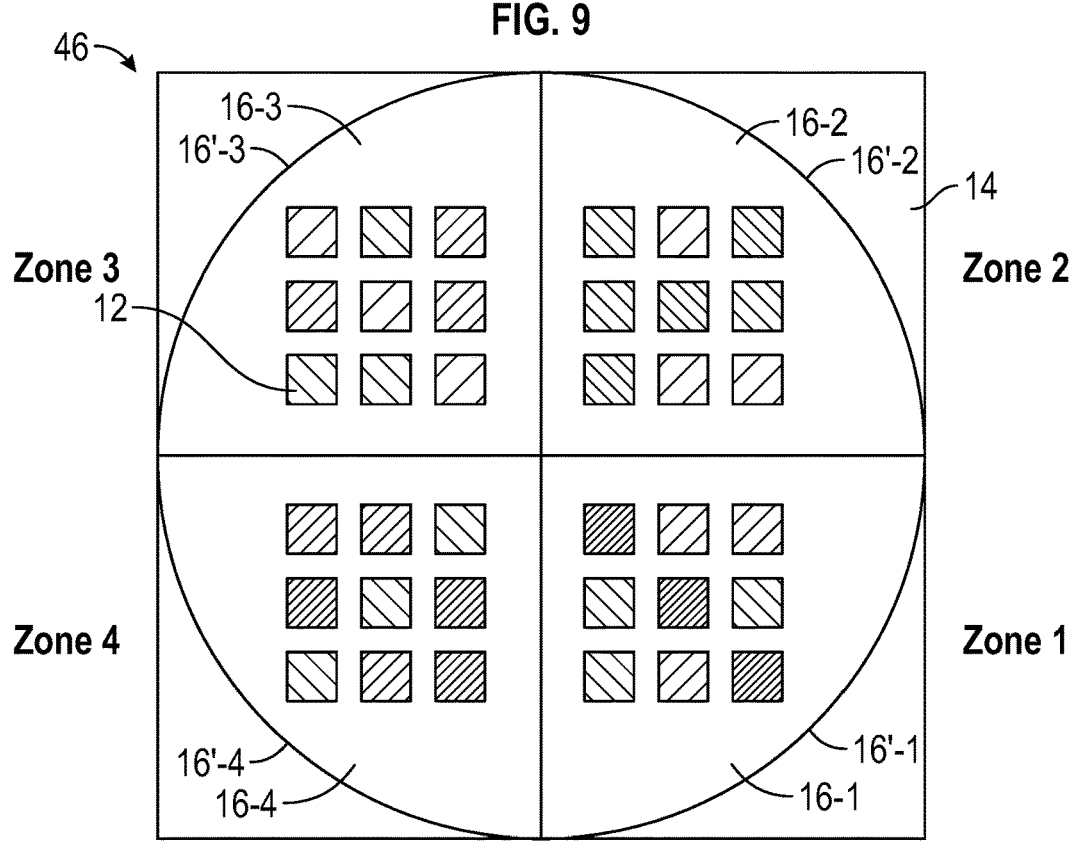

FIG. 10 is a top view of an LED package that is similar to the LED package of FIG. 9, but the shape of each separate lens is arranged to collectively form a larger overall lens for the LED package.

FIG. 11 is a cross-sectional view of an LED package that is similar to the LED package of FIG. 2 and illustrates an arrangement where the encapsulant provides common encapsulation across all of the zones.

FIG. 12 is a cross-sectional view of an LED package that is similar to the LED package of FIG. 11 but for embodiments where the encapsulant forms a different lens for each of the zones.

Figure 13:
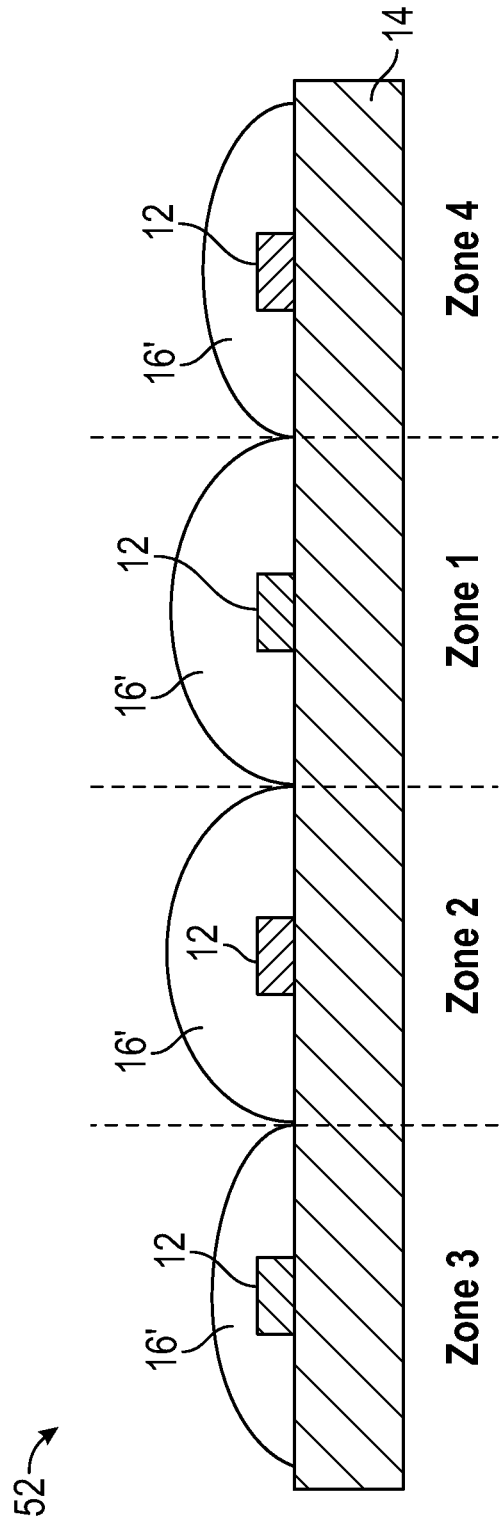

FIG. 13 is a cross-sectional view of an LED package that is similar to the LED package of FIG. 12 but for embodiments where each individual LED chip is arranged with a separate lens.

Figure 14:
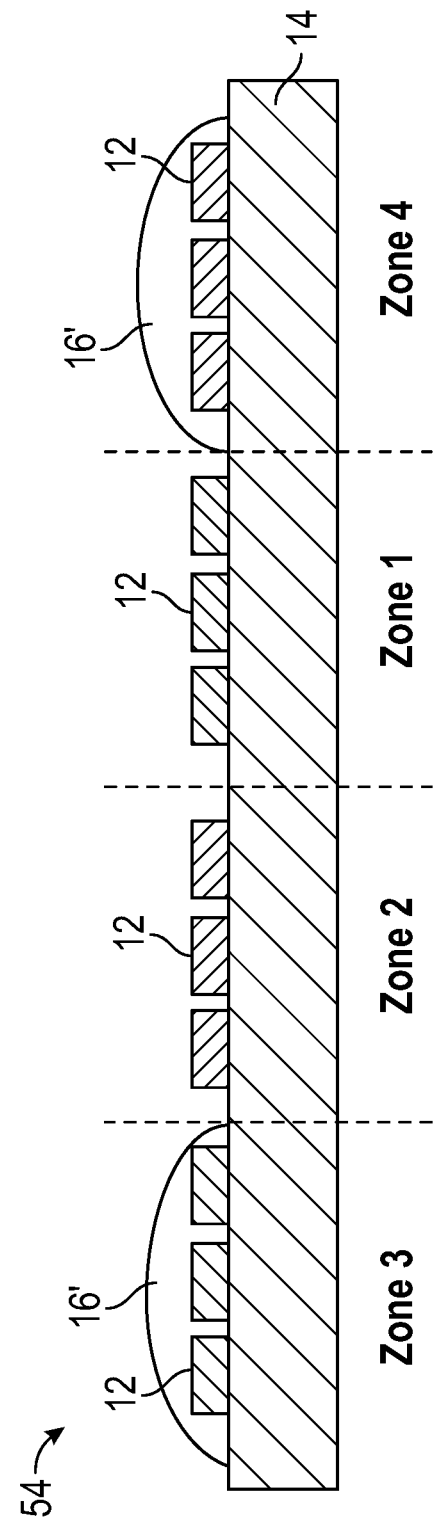

FIG. 14 is a cross-sectional view of an LED package that is similar to the LED package of FIG. 12 but for embodiments where not all of the LED chips are arranged with a corresponding lens.

Figure 15:
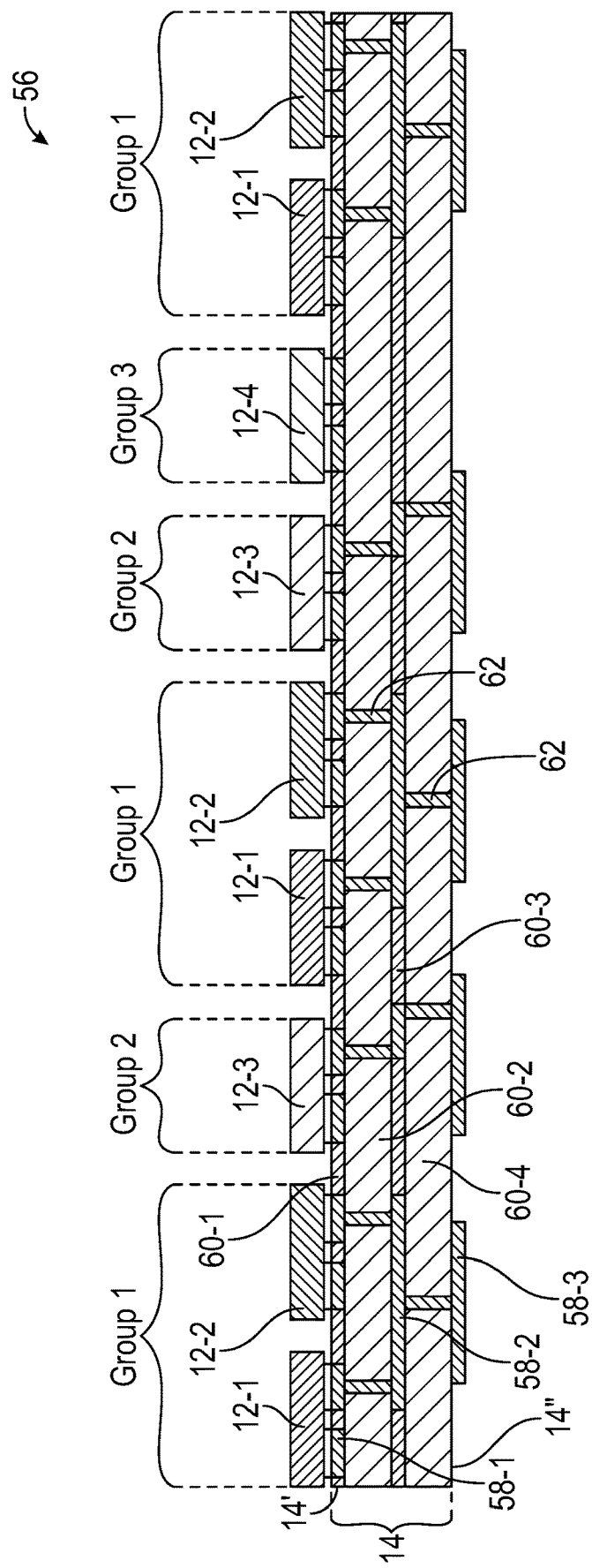

FIG. 15 is a cross-sectional view of an LED package that is similar to the LED package of FIG. 7, but where the submount embodies a multiple layer ceramic substrate that provides separate electrical connections for different ones of the LED chips.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

The present disclosure relates to light-emitting diode (LED) packages, and more particularly to broad electromagnetic spectrum LED packages. Individual LED packages are disclosed that are capable of emitting various combinations of peak wavelengths across a broad electromagnetic spectrum, including one or more combinations of ultraviolet (UV), visible, and infrared (IR) peak wavelengths. Such LED packages may also be broadly tunable across portions of the electromagnetic spectrum ranging from UV to IR wavelengths. By providing such capabilities within a single light source provided by a single LED package, larger and more complex systems for broadband emissions that include multiple light sources, complex optical systems, mirrors, filters, and additional components may be avoided. LED chip arrangements, control schemes, and encapsulant arrangements are also discloses for such broad electromagnetic spectrum LED packages.

Before delving into specific details of various aspects of the present disclosure, an overview of various elements that may be included in exemplary LED packages of the present disclosure is provided for context. An LED chip typically comprises an active LED structure or region that can have many different semiconductor layers arranged in different ways. The fabrication and operation of LEDs and their active structures are generally known in the art and are only briefly discussed herein. The layers of the active LED structure can be fabricated using known processes with a suitable process being fabrication using metal organic chemical vapor deposition. The layers of the active LED structure can comprise many different layers and generally comprise an active layer sandwiched between n-type and p-type oppositely doped epitaxial layers, all of which are formed successively on a growth substrate. It is understood that additional layers and elements can also be included in the active LED structure, including, but not limited to, buffer layers, nucleation layers, super lattice structures, undoped layers, cladding layers, contact layers, and current-spreading layers and light extraction layers and elements. The active layer can comprise a single quantum well, a multiple quantum well, a double heterostructure, or super lattice structures.

The active LED structure can be fabricated from different material systems, with some material systems being Group III nitride-based material systems. Group III nitrides refer to those semiconductor compounds formed between nitrogen (N) and the elements in Group III of the periodic table, usually aluminum (Al), gallium (Ga), and indium (In). Gallium nitride (GaN) is a common binary compound. Group III nitrides also refer to ternary and quaternary compounds such as aluminum gallium nitride (AlGaN), indium gallium nitride (InGaN), and aluminum indium gallium nitride (AlInGaN). For Group III nitrides, silicon (Si) is a common n-type dopant and magnesium (Mg) is a common p-type dopant. Accordingly, the active layer, n-type layer, and p-type layer may include one or more layers of GaN, AlGaN, InGaN, and AlInGaN that are either undoped or doped with Si or Mg for a material system based on Group III nitrides. Other material systems include silicon carbide (SiC), organic semiconductor materials, and other Group III-V systems such as gallium phosphide (GaP), gallium arsenide (GaAs), and related compounds.

The active LED structure may be grown on a growth substrate that can include many materials, such as sapphire, SiC, aluminum nitride (AlN), and GaN, with a suitable substrate being a 4H polytype of SiC, although other SiC polytypes can also be used including 3C, 6H, and 15R polytypes. SiC has certain advantages, such as a closer crystal lattice match to Group III nitrides than other substrates and results in Group III nitride films of high quality. SiC also has a very high thermal conductivity so that the total output power of Group III nitride devices on SiC is not limited by the thermal dissipation of the substrate. Sapphire is another common substrate for Group III nitrides and also has certain advantages, including being lower cost, having established manufacturing processes, and having good light-transmissive optical properties.

Different embodiments of the active LED structure can emit different wavelengths of light depending on the composition of the active layer and n-type and p-type layers. In certain embodiments, the active LED structure emits blue light with a peak wavelength range of approximately 430 nanometers (nm) to 480 nm. In certain embodiments, the active LED structure emits green light with a peak wavelength range of 500 nm to 570 nm. In certain embodiments, the active LED structure emits orange and/or red light with a peak wavelength range of 600 nm to 700 nm. In certain embodiments, the active LED structure may be configured to emit light that is outside the visible spectrum, including one or more portions of the UV spectrum, the IR or near-IR spectrum. The UV spectrum is typically divided into three wavelength range categories denoted with letters A, B, and C. In this manner, UV-A light is typically defined as a peak wavelength range from 315 nm to 400 nm, UV-B is typically defined as a peak wavelength range from 280 nm to 315 nm, and UV-C is typically defined as a peak wavelength range from 100 nm to 280 nm. UV LEDs are of particular interest for use in applications related to the disinfection of microorganisms in air, water, and surfaces, among others. In other applications, UV LEDs may also be provided with one or more lumiphoric materials to provide LED packages with aggregated emissions having a broad spectrum and improved color quality for visible light applications. Near-IR and/or IR wavelengths for LED structures of the present disclosure may have wavelengths above 700 nm, such as in a range from 750 nm to 1100 nm, or more.

Embodiments of the present disclosure may combine multiple LED chips with different active LED structures to provide broadband spectral emissions in LED packages. In this manner, certain aspects of the present disclosure relate to an LED package that is capable of providing broad spectral emissions across the UV spectrum, the visible light spectrum, and the IR spectrum. As used herein, the UV spectrum may encompass peak wavelengths in a range from 100 nm to 400 nm, the visible spectrum may encompass peak wavelengths in a range from 400 nm to 750 nm, and the IR spectrum may encompass peak wavelengths in a range from 750 nm to 1100 nm.

An LED chip can also be covered with one or more lumiphoric materials (also referred to herein as lumiphors), such as phosphors, such that at least some of the light from the LED chip is absorbed by the one or more lumiphors and is converted to one or more different wavelength spectra according to the characteristic emission from the one or more lumiphors. In this regard, at least one lumiphor receiving at least a portion of the light generated by the LED source may re-emit light having different peak wavelength than the LED source. An LED source and one or more lumiphoric materials may be selected such that their combined output results in light with one or more desired characteristics such as color, color point, intensity, etc. In certain embodiments, aggregate emissions of LED chips, optionally in combination with one or more lumiphoric materials, may be arranged to provide cool white, neutral white, or warm white light, such as within a color temperature range of from 2500 Kelvin (K) to 10,000 K. In certain embodiments, lumiphoric materials having cyan, green, amber, yellow, orange, and/or red peak wavelengths may be used. In some embodiments, the combination of the LED chip and the one or more lumiphors (e.g., phosphors) emits a generally white combination of light. The one or more phosphors may include yellow (e.g., YAG:Ce), green (e.g., LuAg:Ce), and red (e.g., $Ca_{t-x-y}Sr_xEu_yAlSiN_3$) emitting phosphors, and combinations thereof.

Lumiphoric materials as described herein may be or include one or more of a phosphor, a scintillator, a lumiphoric ink, a quantum dot material, a day glow tape, and the like. Lumiphoric materials may be provided by any suitable means, for example, direct coating on one or more surfaces of an LED, dispersal in an encapsulant material configured to cover one or more LEDs, and/or coating on one or more optical or support elements (e.g., by powder coating, inkjet printing, or the like). In certain embodiments, lumiphoric materials may be downconverting or upconverting, and combinations of both downconverting and upconverting materials may be provided. In certain embodiments, multiple different (e.g., compositionally different) lumiphoric materials arranged to produce different peak wavelengths may be arranged to receive emissions from one or more LED chips. One or more lumiphoric materials may be provided on one or more portions of an LED chip in various configurations. In certain embodiments, one or more surfaces of LED chips may be conformally coated with one or more lumiphoric materials, while other surfaces of such LED chips may be devoid of lumiphoric material. In certain embodiments, a top surface of an LED chip may include lumiphoric material, while one or more side surfaces of an LED chip may be devoid of lumiphoric material. In certain embodiments, all or substantially all outer surfaces of an LED chip (e.g., other than contact-defining or mounting surfaces) are coated or otherwise covered with one or more lumiphoric materials. In certain embodiments, one or more lumiphoric materials may be arranged on or over one or more surfaces of an LED chip in a substantially uniform manner. In other embodiments, one or more lumiphoric materials may be arranged on or over one or more surfaces of an LED chip in a manner that is non-uniform with respect to one or more of material composition, concentration, and thickness. In certain embodiments, the loading percentage of one or more lumiphoric materials may be varied on or among one or more outer surfaces of an LED chip. In certain embodiments, one or more lumiphoric materials may be patterned on portions of one or more surfaces of an LED chip to include one or more stripes, dots, curves, or polygonal shapes. In certain embodiments, multiple lumiphoric materials may be arranged in different discrete regions or discrete layers on or over an LED chip.

In certain embodiments, one or more lumiphoric materials may be provided as at least a portion of a wavelength conversion element. Wavelength conversion elements may include a support element, such as a superstrate, and one or more lumiphoric materials that are provided by any suitable means, such as by coating a surface of the superstrate or by incorporating within the superstrate. The term "superstrate" as used herein refers to an element placed on or over an LED chip that may include a lumiphoric material. The term "superstrate" is used herein, in part, to avoid confusion with other substrates that may be part of the semiconductor light-emitting device, such as a growth or carrier substrate of the LED chip or a submount of an LED package. The term "superstrate" is not intended to limit the orientation, location, and/or composition of the structure it describes. In some embodiments, the superstrate may be composed of a transparent material, a semi-transparent material, or a light-transmissive material, such as sapphire, SiC, silicone, and/or glass (e.g., borosilicate and/or fused quartz). Superstrates may be formed from a bulk substrate which is optionally patterned and then singulated.

One or more lumiphoric materials may be arranged on the superstrate by, for example, spraying and/or otherwise coating the superstrate with the lumiphoric materials. Wavelength conversion elements may be attached to one or more LED chips using, for example, a layer of transparent adhesive. In other embodiments, wavelength conversion elements may comprise alternative configurations, such as phosphor-in-glass or ceramic phosphor plate arrangements. Phosphor-in-glass or ceramic phosphor plate arrangements may be formed by mixing phosphor particles with glass frit or ceramic materials, pressing the mixture into planar shapes, and firing or sintering the mixture to form a hardened structure that can be cut or separated into individual wavelength conversion elements.

As used herein, a layer or region of a light-emitting device may be considered to be "transparent" when at least 80% of emitted radiation that impinges on the layer or region emerges through the layer or region. Moreover, as used herein, a layer or region of an LED is considered to be "reflective" or embody a "mirror" or a "reflector" when at least 80% of the emitted radiation that impinges on the layer or region is reflected. In some embodiments, the emitted radiation comprises visible light such as blue and/or green LEDs with or without lumiphoric materials. In other embodiments, the emitted radiation may comprise nonvisible light. For example, in the context of GaN-based blue and/or green LEDs, silver (Ag) may be considered a reflective material (e.g., at least 80% reflective). In the case of UV LEDs, appropriate materials may be selected to provide a desired, and in some embodiments high, reflectivity and/or a desired, and in some embodiments low, absorption. In certain embodiments, a "light-transmissive" material may be configured to transmit at least 50% of emitted radiation of a desired wavelength.

The present disclosure can be useful for LED chips having a variety of geometries, such as vertical geometry or lateral geometry. A vertical geometry LED chip typically includes anode and cathode connections on opposing sides or faces of the LED chip. A lateral geometry LED chip typically includes both anode and cathode connections on the same side of the LED chip that is opposite a substrate, such as a growth substrate. In some embodiments, a lateral geometry LED chip may be mounted on a submount of an LED package such that the anode and cathode connections are on a face of the LED chip that is opposite the submount. In this configuration, wirebonds may be used to provide electrical connections with the anode and cathode connections. In other embodiments, a lateral geometry LED chip may be flip-chip mounted on a surface of a submount of an LED package such that the anode and cathode connections are on a face of the active LED structure that is adjacent to the submount. In this configuration, electrical traces or patterns may be provided on the submount for providing electrical connections to the anode and cathode connections of the LED chip. In a flip-chip configuration, the active LED structure is configured between the substrate of the LED chip and the submount for the LED package. Accordingly, light emitted from the active LED structure may pass through the substrate in a desired emission direction. In other embodiments, an active LED structure may be bonded to a carrier submount, and the growth substrate may be removed such that light may exit the active LED structure without passing through the growth substrate.

According to aspects of the present disclosure, LED structures may be incorporated within packages that may include one or more elements, such as lumiphoric materials, encapsulants, light-altering materials, lens, and electrical contacts, among others, that are provided with one or more LED chips. In certain aspects, packages may include a support member, such as a submount or a lead frame. Light-altering materials may be arranged within packages to reflect or otherwise redirect light from the one or more LED chips in a desired emission direction or pattern. As used herein, light-altering materials may include many different materials including light-reflective materials that reflect or redirect light, light-absorbing materials that absorb light, and materials that act as a thixotropic agent. As used herein, the term "light-reflective" refers to materials or particles that reflect, refract, scatter, or otherwise redirect light. For light-reflective materials, the light-altering material may include at least one of fused silica, fumed silica, titanium dioxide ($TiO_2$), or metal particles suspended in a binder, such as silicone or epoxy. In certain aspects, the particles may have an index or refraction that is configured to refract light emissions in a desired direction. In certain aspects light-reflective particles may also be referred to as light-scattering particles. A weight ratio of the light-reflective particles or scattering particles to a binder may comprise a range of about 1:1 to about 2:1. For light-absorbing materials, the light-altering material may include at least one of carbon, silicon, or metal particles suspended in a binder, such as silicone or epoxy. The light-reflective materials and the light-absorbing materials may comprise nanoparticles. In certain embodiments, the light-altering material may comprise a generally white color to reflect and redirect light. In other embodiments, the light-altering material may comprise a generally opaque or black color for absorbing light and increasing contrast. In certain embodiments, the light-altering material includes both light-reflective material and light-absorbing material suspended in a binder.

In certain aspects, the present disclosure is related to LED packages that are capable of emitting various combinations of light across a broad electromagnetic spectrum, including one or more combinations of UV, visible, and IR wavelengths. In certain embodiments, a single LED package may be broadly tunable across portions of the electromagnetic spectrum ranging from UV to IR wavelengths. Applications for such LED packages include various color-changing lighting applications that may benefit from high precision spectral output and dynamic spectral tuning. One such application is spectral imaging where a sample may be selectively imaged at various wavelengths to selectively illuminate different compounds and/or materials for building a histogram of data with improved resolution. The ability to excite and/or illuminate samples with different combinations of light may enable greater sensitivity and contrast of test samples. Another application may involve biomedical diagnostic tools that are used in the detection of viral, bacterial, and/or toxic compounds in biological samples. Conventional biomedical diagnostics typically involve spectroscopy techniques beyond ultraviolet-visible-near infrared (UV-VIS-NIR) spectroscopy, such as Raman or IR spectroscopy in order to provide unique information for molecular identification. UV-VIS-NIR spectroscopy for large molecules with broad absorption spectrums may be difficult to uniquely characterize, particularly when large molecules grow within a biological sample. With the ability to selectively illuminate and/or excite biological samples, tunable broad electromagnetic spectrum LED packages of the present disclosure may enable the ability to focus on a particular target area and then selectively scan through multiple wavelengths to create a uniquely identifiable signature with UV-VIS-IR absorption and/or fluorescence spectroscopy techniques. Still further applications include LED packages for use in food and/or industrial spectroscopy for quality control and detection of contamination; macroscopic imaging where LED packages combined with detectors may image real world objects in the UV, visible, and IR spectrums to capture images not fully visible with the human eye; and Li-Fi wireless communications where different wavelengths within the LED packages may be used for communications and other wavelengths may be used for other purposes, including general illumination.

Conventional broadband light sources are typically metal halide arc lamps and selectivity for individual peak wavelengths is accomplished through the selection of various combinations of low-pass filters, high-pass filters, and neutral-density filters. In this regard, selectively combining two different wavelength bands and/or selectively tuning wavelength emissions is not achievable by such conventional light sources since different filters may be incompatible for simultaneous use. According to aspects of the present disclosure, a single LED package is provided with the capability to emit broadband spectral emissions from UV to IR wavelengths and/or various combinations of peak wavelengths within this range while also providing the ability to dynamically tune such emissions. In this regard, such advantages may be provided by a single LED package, rather than relying on larger and more complex systems that include multiple light sources for each unique wavelength, complex optical systems, mirrors, filters, and additional components.

FIG. 1A is a top view of an exemplary LED package 10 that is configured to provide broadband electromagnetic spectral emissions from UV to IR wavelengths and various combinations of peak wavelengths thereof according to principles of the present disclosure. FIG. 1B is a cross-sectional view of the LED package 10 of FIG. 1A taken along the sectional line 1B-1B of FIG. 1A. In order to provide broadband spectral emissions, the LED package 10 includes a plurality of LED chips 12 that are mounted on a submount 14. As will be described later, individual ones of the LED chips 12 may be configured to provide different peak wavelengths across the UV to IR spectrum, including but not limited to one or more LED chips 12 that provide various UV peak wavelengths, one or more LED chips 12 that provide various visible peak wavelengths, and one or more LED chips 12 that provide various IR peak wavelengths. As will also be described later in greater detail, the LED package 10 may be configured such that each of the LED chips 12 is independently addressable, thereby providing the capability to select various combinations of peak wavelengths, dynamically tune spectral emissions, and/or provide combined broadband emissions that include UV, visible, and IR peak wavelengths.

The submount 14 may be formed of many different materials with a preferred material being electrically insulating. Suitable materials include but are not limited to ceramic materials such as aluminum oxide or alumina, aluminum nitride, or organic insulators like polyimide (PI) and polyphthalamide (PPA). In other embodiments the submount 14 can comprise a printed circuit board (PCB), sapphire, silicon or any other suitable material. For PCB embodiments different PCB types can be used such as standard FR-4 PCB, metal core PCB, or any other type of PCB. The LED package 10 may be fabricated by a method that utilizes a submount panel sized to accommodate a plurality of submounts 14. Multiple LED packages 10 may be formed together on the panel, with an individual LED package 10 being singulated from the panel. The LED chips 12 may be mounted to the submount 14 using various methods and material mounting such as conventional solder materials that may or may not contain a flux material, dispensed polymeric materials that may be thermally and electrically conductive, as well as other methods and material mounting such as solderless, direct attach, or other attachment adhesives.

The LED package 10 may further include an encapsulant 16 that may provide both environmental and/or mechanical protection for the LED chips 12. The encapsulant 16 may also be referred to as an encapsulant layer. The encapsulant 16 may be provided to encapsulate exposed portions of the LED chips 12, and/or cover and contact portions of the submount 14 that are between adjacent ones of the LED chips 12, and/or cover and contact portions of the submount 14 that are arranged adjacent to and/or around a perimeter of the plurality of LED chips 12. In certain embodiments, the encapsulant 16 may directly contact one or more of the above-described portions of the submount 14 and directly contact one or more of the LED chips 12 including any corresponding lumiphoric materials that may be associated with various ones of the LED chips 12. Many different materials can be used for the encapsulant 16, including silicones, plastics, epoxies or glass, with a suitable material being compatible with molding processes. Silicone is suitable for molding and provides suitable optical transmission properties for light emitted from the LED chips 12.

In certain embodiments, the encapsulant 16 may be molded into the shape of a lens 16' that covers the LED chips 12 and serves to shape their combined spectral outputs. In this regard, the lens 16' of the LED package 10 may be configured to shape, collimate, and/or mix different peak wavelengths of light across the UV, visible, and IR spectrums. A lens base 16" may be defined where the encapsulant 16 contacts portions of the submount 14. In certain embodiments, the lens base 16" may form one or more vertical sidewalls of the encapsulant 16 for redirecting some lateral emissions from the LED chips 12. The one or more vertical sidewalls may extend to a height above the submount 14 that is greater than heights of the LED chips 12. Depending on the desired emission pattern for the LED package 10, the lens base 16" may form a curved shape that is continuous with other portions of the lens 16' in other embodiments. Different molding techniques may provide the lens 16' and the lens base 16" with many different shapes depending on the desired shape of the light output, including hemispheric, ellipsoid bullet, flat, hex-shaped and square. In some embodiments, a suitable shape for the lens 16' includes both curved and planar surfaces, such as a hemispheric top portion with planar side surfaces at the lens base 16". It is understood that the encapsulant 16 can also be textured to improve light extraction or contain materials such as phosphors or scattering particles.

FIG. 1C is a spectral emission plot indicating various peak wavelengths that may be emitted by the LED chips 12 in the LED package 10 of FIGS. 1A and 1B. In various embodiments, different ones of the LED chips (labeled as 12-1 to 12-15 in FIG. 1C) may be configured to provide different peak wavelengths anywhere in the range from 100 nm to 1100 nm. For example, the LED chips 12-1 to 12-3 are configured to emit different peak wavelengths within the UV spectrum defined up to about 400 nm, the LED chips 12-4 to 12-11 are configured to emit different peak wavelengths within the visible spectrum from 400 nm to about 750 nm, and the LED chips 12-12 to 12-15 are configured to emit different peak wavelengths within the IR spectrum from 750 nm to 1100 nm. In this regard, a specific embodiment for the LED package 10 of FIGS. 1A and 1B is directed to the capability of providing at least 15 different peak wavelengths from the UV spectrum all the way to the IR spectrum. In certain embodiments, each peak wavelength provided by individual ones of the LED chips 12-1 to 12-15 may differ from the next closest peak wavelength by at least 10 nm, or in a range from 10 nm to 20 nm, or in a range from 10 nm to 50 nm. In certain embodiments, the LED package 10 of FIGS. 1A and 1B may be configured such that each of the LED chips 12-1 to 12-15 is independently addressable, thereby providing the capability to select various combinations of peak wavelengths, dynamically tune spectral emissions, and/or provide combined broadband emissions that include UV, visible, and IR peak wavelengths.

While the exemplary embodiment of FIG. 1C illustrates 15 different LED chips 12-1 to 12-15 that provide 15 different peak wavelengths, the principles described herein may also be applicable to LED packages with other numbers of chips and other numbers of peak wavelengths. For example, the number of different LED chips in the LED package 10 may be provided in a range from 5 to 20, or in a range from 5 to 15, or in a range from 10 to 20 that are configured to provide corresponding numbers of different peak wavelengths.

Combining such large numbers of different peak wavelengths across portions of the UV, visible, and IR spectrums creates several challenges beyond simple placement of multiple LED chips in a conventional LED package. Such challenges relate to inherent differences between LED chips having different peak wavelengths. One difference relates to different material types that are used for LED chips having such different peak wavelengths, where different material types usually require different turn-on voltages. For example, a first material type may include GaN-based LED chips that emit light with a peak wavelength in a range from 100 nm to about 530 nm, a second material type may include GaP-based LED chips that may emit light with a peak wavelength in a range from above 530 nm to 700 nm, and a third material type may include GaAs-based LED chips that may emit light with a peak wavelength in a range from about 600 nm to about 1100 nm. Specific turn-on voltage ratings for different material types can range from about 1.7 volts (V) to 4 V or greater and each can be accordingly rated with different maximum forward voltage ($V_f$) ratings. In this regard, LED chips with $V_f$ ratings in a range from about 1.7 V to 2.5 V may have max $V_f$ ratings that are below minimum turn-on voltages for other material types. The specific material types and ranges described above are exemplary and not meant to be inclusive of all material types and wavelength ranges. Another difference relates to how different peak wavelengths of light interact with encapsulant and/or lens materials. For example, index of refraction and/or light transmissivity values of a particular material may vary based on peak wavelength. In this regard, a material type for the encapsulant and/or lens may interact differently with different peak wavelengths of light. According to various embodiments of the present disclosure, arrangements of LED chips, electrical connection schemes, and/or arrangements of encapsulant/lens materials are disclosed that enable the ability to provide such a broad spectral range of peak wavelengths within a single LED package or component.

FIG. 2 is a top view of a portion of an LED package 18 that is similar to the LED package 10 described above for FIGS. 1A-1C, and further includes a specific arrangement of LED chips 12-1 to 12-16 based on different material types, peak wavelengths, and/or forward voltage values. For illustrative purposes, the submount 14 and encapsulant 16 of FIGS. 1A and 1B are omitted in FIG. 2, although they may each be present in the LED package 18. In FIG. 2, the LED chips 12-1 to 12-16 may each emit a different peak wavelength and the LED chips 12-1 to 12-16 are arranged to collectively form a large LED array within the LED package 18. The LED array may be subdivided in different zones based on grouping of at least one of material types, peak wavelength ranges, and forward voltage values for the LED chips 12-1 to 12-16. For example, zone 1 may comprise a subgroup of the LED chips 12-1 to 12-4 that are configured to emit peak wavelengths in a range from 100 nm to 400 nm, zone 2 may comprise a subgroup of the LED chips 12-5 to 12-8 that are configured to emit peak wavelengths in a range from 400 nm to 550 nm, zone 3 may comprise a subgroup of the LED chips 12-9 to 12-12 that are configured to emit peak wavelengths in a range from 550 nm to 750 nm, and zone 4 may comprise a subgroup of the LED chips 12-13 to 12-16 that are configured to emit peak wavelengths in a range from 750 nm to 1100 nm. In certain embodiments, the zones 1 to 4 are nonoverlapping with one another so that similar ones of the LED chips 12-1 to 12-16 are spatially grouped together within different portions of the LED array. In certain embodiments, the LED chips within each zone (12-1 to 12-4 for zone 1, 12-5 to 12-8 for zone 2, 12-9 to 12-12 for zone 3, and 12-13 to 12-16 for zone 4) may comprise a range of $V_f$ turn-on values that do not exceed the maximum $V_f$ rating for any LED chip within the particular zone. Additionally, the maximum $V_f$ ratings between the zones can differ by at least 1 V, or in a range from 0.5 V to 1.5 V. By way of example, zones 1 and 2 may include GaN-based LED chips 12-1 to 12-8 with maximum $V_f$ ratings of about 4 V or within about 0.5 V of one another, and zones 2 and 3 may include GaP-based LED and/or GaAs-based LED chips with maximum $V_f$ ratings in a range from 2 to 3 V or within about 0.5 V of one another. In this regard, electrical connection schemes may be readily tailored differently in different portions of the LED package 18 based on the different zones.

FIG. 3 is a top view of a portion of the LED package 20 that is similar to the LED package 18 of FIG. 2 and illustrates a connection scheme where similar colored ones of the LED chips 12-1 to 12-4 within a zone are arranged in different serial strings 22-1 to 22-4 that are coupled to a common ground connection. For example, the top horizontal row in FIG. 3 may include a serial string 22-1 of the LED chips 12-1, the next horizontal row may include a serial string 22-2 of the LED chips 12-2, the next horizontal row may include a serial string 22-3 of the LED chips 12-3, and the bottom horizontal row may include a serial string 22-4 of the LED chips 12-4. As previously described, each of the LED chips 12-1 to 12-4 may emit different peak wavelengths (at least 10 nm from one another) within a particular range of peak wavelengths that may define zone 1, such as a range from 100 nm to 450 nm. Each of the serial strings 22-1 to 22-4 may have different anode connections (labeled as + in FIG. 3) and a common ground connection (labeled as GND in FIG. 3). Accordingly, each serial string 22-1 to 22-4 of the LED chips 12-1 to 12-4 may be electrically activated and deactivated in an independent manner. The electrical connections between the anode connections and the common ground for each of the strings 22-1 to 22-4 may be formed by any number of manners, including wire bond connections and/or electrical traces that are patterned on the submount 14. While only zone 1 is illustrated in FIG. 3, the principles disclosed are applicable to each of the plurality of zones 1-4 illustrated in FIG. 2.

FIG. 4 is a top view of a portion of an LED package 24 that is similar to the LED package 18 of FIG. 2 and illustrates another connection scheme that allows multiplexing of each individual one of the LED chips within a zone. In FIG. 4, the LED chips within the zone are generally illustrated as LED 1 to 25 and the zone could represent any of the zones 1-4 as illustrated in FIG. 2. In certain embodiments, ground electrical connections may be provided by a plurality of rows (ROW 1 to 5) and anode electrical connections may be provided by a plurality of columns (COL 1 to COL 5) such that each individual LED is coupled to a unique combination of a column and a row. In this manner, each individual LED within the zone may be electrically activated and deactivated in an independent manner. For example, in FIG. 4, the LED 8 may be electrically activated and deactivated independently by addressing COL 3 and ROW 2. It is appreciated that the electrical connections could be reversed such that the anode electrical connections are provided by the rows and the ground electrical connections are provided by the columns. While only a single zone is illustrated in FIG. 4, the principles disclosed are applicable to each of the plurality of zones 1-4 illustrated in FIG. 2.

In certain embodiments, the configurations described for FIG. 3 and FIG. 4 may be combinable within a single LED package. In this regard, the single LED package may include a first zone with electrical connections configured for multiplexing as described for FIG. 4 and a second zone with serial strings of like-colored LED chips as described for FIG. 3.

FIG. 5A is a top view of a portion of an LED package 26 that is similar to the LED package 18 of FIG. 2 and illustrates another connection scheme where LED chips 12-1 to 12-16 within a particular zone are arranged in at least one serial string 22-1 to 22-4 and shunt paths are arranged to allow individual electrical control of each LED chip 12-1 to 12-16 within each serial string 22-1 to 22-4. FIG. 5B is a general circuit diagram representing the electrical connection scheme of the LED package 26 of FIG. 5A. The shunt paths are defined by shunt devices 28 that may be arranged between each of the LED chips 12-1 to 12-16 in each of the serial strings 22-1 to 22-4. In certain embodiments, the shunt devices 28 may embody electrical switches, such as gate-controlled semiconductor devices including at least one of a field-effect transistor (FET), a metal-oxide-semiconductor field-effect transistor (MOSFET), and an insulated-gate bipolar transistor (IGBT). The shunt devices 28 may be controlled by a separate microcontroller 29. In certain embodiments, the microcontroller 29 may be provided within the LED package 26 for improved device integration. Although in other embodiments, the microcontroller 29 may be provided separately from the LED package 26. By providing the shunt devices 28 in this manner, each of the LED chips 12-1 to 12-16 within each serial string 22-1 to 22-4 may be electrically activated and deactivated independently from other LED chips 12-1 to 12-16 within each serial string 22-1 to 22-4. In this regard, each serial string 22-1 to 22-4 may be populated with LED chips 12-1 to 12-16 that emit different peak wavelengths. For example, zone 1 may comprise at least one serial string 22-1 where each of the LED chips 12-1 to 12-4 may be grouped according to a maximum voltage rating that is within about 0.5 V of one another and none of the LED chips 12-1 to 12-4 have forward turn-on voltages that exceed the maximum voltage rating for the serial string 22-1. Additionally, one or more of the LED chips 12-1 to 12-4 may emit a peak wavelength that differs from one another by at least 5 nm, or by at least 10 nm, or in a range from 5 nm to 50 nm. While only a single string 22-1 to 22-4 is illustrated for each zone 1-4, it is understood that each zone 1-4 may include multiple ones of corresponding serial strings 22-1 to 22-4.

In certain embodiments, the configurations described for FIGS. 3-5B may be combinable within a single LED package. In this regard, the single LED package may include at least one first zone with electrical connections configured for multiplexing as described for FIG. 4, at least one second zone with serial strings of like-colored LED chips as described for FIG. 3, and at least one third zone configured with serial strings and shunt devices as described for FIGS. 5A and 5B.

FIG. 6 is a cross-sectional view of an LED package 30 that is similar to the LED package 18 of FIG. 2 and illustrates another connection scheme that includes control circuitry 32 that is integrated with the submount 14. In certain aspects, the control circuitry 32 may comprise an application-specific integrated circuit (ASIC) for controlling operation of the LED chips 12-1 to 12-9. As used herein, the integrated control circuitry 32, such as an ASIC, may be configured to provide at least one of: power to the LED chips 12-1 to 12-9; a common ground connected to each of the LED chips 12-1 to 12-9; logic layers that tie into individual power feeds for each of the LED chips 12-1 to 12-9; digital communication signals for selectively activating, deactivating, and/or dimming the LED chips 12-1 to 12-9; and communication to switching elements for controlling the LED chips 12-1 to 12-9. In certain embodiments, the control circuitry 32 may be provided in one or more layers that are arranged at or near a first face 14' of the submount 14 such that the control circuitry 32 is arranged between the LED chips 12-1 to 12-9 and other portions of the submount 14. Layers of the control circuitry 32 may embody logic layers, such as one or more logic layers of an ASIC. The LED chips 12-1 to 12-9 may include contacts 34 (i.e., anode and cathode contacts) configured for flip-chip mounting to the submount 14 and/or one or more portions of the control circuitry 32. In this regard, the LED chips 12-1 to 12-9 may be configured to provide one or more groupings of different peak wavelength emissions, such as the zones previously described, and the connection scheme of FIG. 6 allows the LED chips 12-1 to 12-9 with different peak emissions to be interspersed together for enhanced color mixing.

FIG. 7 is a cross-sectional view of an LED package 36 that is similar to the LED package 30 of FIG. 6 and further illustrates contact pads 38-1 to 38-4 that are provided on a second face 14" of the submount 14, opposite the first face 14'. The second face 14" thereby forms a primary mounting face for the LED package 36 that is opposite a primary emission face (i.e., the first face 14') of the submount 14. Different ones of the contact pads 38-1 to 38-4 may provide different power, control, and/or ground connections that are routed to the control circuitry 32 by way of electrically conductive vias 39-1 to 39-4. Electrical signals between the control circuitry 32 and the LED chips 12-1 to 12-10 may then be routed through various circuit layers 40 with corresponding electrical isolation layers to each of the LED chips 12-1 to 12-10 to provide individual control. As with previous embodiments, the LED chips 12-1 to 12-10 may be configured with different maximum forward voltage ratings and/or different peak emission wavelengths. In certain embodiments, having the control circuitry 32 integrated within the submount 14 provides the ability to form a larger array of the LED chips 12-1 to 12-10 without different spatially segregated zones as described above. In this manner, the LED chips 12-1 to 12-10 that provide one or more combinations of different peak wavelengths may be intermixed within the larger LED array to promote improved color mixing. In other embodiments, the principles described above for FIG. 7 are also applicable to arrangements where the LED chips 12-1 to 12-10 are arranged in zones defined by maximum forward ratings as previously described, for example for FIG. 2.

As described herein, the control schemes described above for FIGS. 3-7 may be provided for LED chips within a single LED package that is similar to the LED package 10 of FIGS. 1A and 1B. These connection and/or control schemes may be configured to provide dynamic dimming and/or dynamic spectral tuning for the single LED package that spans a broad electromagnetic emission spectrum, for example from about 100 nm to about 1100 nm, inclusive of UV, visible, and IR emissions. Different layouts of zones may be provided based on desired light mixing and interactions of different peak wavelengths with encapsulant and/or lens materials. In certain embodiments, encapsulant and/or lens materials and/or shapes may be varied based on proximity to different LED chips that emit different peak wavelengths of light.

FIG. 8A is a top view of an LED package 42 that is similar to the LED package 18 of FIG. 2 and illustrates an alternative layout for the zones 1-3 of differently grouped LED chips 12. FIG. 8B is a cross-sectional view of the LED package 42 of FIG. 8A taken along the sectional line 8B-8B of FIG. 8A. In FIGS. 8A and 8B, the layout of the zones 1-3 is indicated by superimposed dashed lines. As illustrated, zone 1 is centrally provided within the overall array of the LED chips 12, zone 2 is arranged to laterally surround a perimeter of zone 1, and zone 3 is arranged to laterally surround a perimeter of zone 2. In this regard, the zones 1-3 are arranged in a concentric manner with respect to one another. In certain embodiments, zone 2 may laterally surround an entire perimeter of zone 1. In still further embodiments, zone 3 may laterally surround an entire perimeter of zone 2. As previously described, the zones 1-3 may each include different subgroups of the LED chips 12 based on groupings of at least one of material types, peak wavelength ranges, and forward voltage values of the LED chips 12. Each of the zones 1-3 may be controlled according to any of the control schemes described above for FIGS. 3-7. By providing the concentric arrangement of the zones 1-3, the LED chips 12 of zone 1 may be arranged in a position that is centered with respect to a focal point of the lens 16' and the LED chips 12 of zone 3 may be arranged closest to the lens base 16". In a specific example, the LED chips 12 of zones 1 and 2 may be configured to emit various peak wavelengths across the visible spectrum and/or the IR spectrums, while the LED chips 12 of zone 3 may be configured to emit various peak wavelengths in the UV spectrum. In this manner, shorter wavelength emissions that tend to bend or refract more when passing through an interface may be arranged closer to a periphery of the lens 16'.

FIG. 9 is a top view of an LED package 44 that is similar to the LED package 18 of FIG. 2 but includes a separate lens 16'-1 to 16'-4 for each of the zones 1-4. In certain embodiments, encapsulant materials may have different light transmissive properties and/or indexes of refraction based on different peak wavelengths of light. It may therefore be challenging to find a single encapsulant material that is uniformly transmissive to light across such a broad range of peak wavelengths provided by the zones 1-4. Stated differently, a same lens material may transmit light from some of the zones 1-4 with increased efficiency compared with others of the zones 1-4. In this regard, the LED package 44 includes a different encapsulant 16-1 to 16-4 that is registered with each individual zone 1-4. Each encapsulant 16-1 to 16-4 may comprise a material with light transmissive properties and/or indexes of refraction that are selected for each of the underlying LED chips 12 within the respective zone 1-4. In this regard, at least one of the encapsulants 16-1 to 16-4 comprises a different material having different light transmissive properties and/or a different index of refraction than at least one other of the encapsulants 16-1 to 16-4. By way of example, zones 1 and 2 may be arranged with LED chips 12 configured to emit various peak wavelengths across the visible spectrum, zone 3 may be arranged with LED chips 12 configured to emit various peak wavelengths in the UV spectrum, and zone 4 may be arranged with LED chips 12 configured to emit various peak wavelengths in the IR spectrum. In this example, the materials of encapsulants 16-3 and 16-4 may be different from each other and also differ from both the materials of encapsulants 16-1 and 16-2. The encapsulant 16-1 and 16-2 materials may be the same as each other in certain embodiments, and different from one another in other embodiments. In still further embodiments, each of the encapsulant 16-1 to 16-4 materials may be different from one another.

FIG. 10 is a top view of an LED package 46 that is similar to the LED package 44 of FIG. 9 but the shape of each separate lens 16'-1 to 16'-4 is arranged to collectively form a larger overall lens for the LED package 46. By way of example, each of the separate lenses 16'-1 to 16'-4 in FIG. 10 is provided with a shape that forms a portion of an overall lens having a circular base. Accordingly, each portion of the overall lens may comprise an individual encapsulant 16-1 to 16-4 that provides improved light transmissive properties and/or index of refraction values for the corresponding zone 1-4 it is registered with. As such, at least one of the encapsulants 16-1 to 16-4 comprises a different material having different light transmissive properties and/or index of refraction values than at least one other of the encapsulants 16-1 to 16-4. In further embodiments, each of the encapsulants 16-1 to 16-4 may comprise a different material with different light transmissive properties than others of the encapsulants 16-1 to 16-4. In certain embodiments, each lens 16'-1 to 16'-4 may be formed separately by a multiple masking and/or molding process. While an overall lens collectively formed by the lenses 16'-1 to 16'-4 is illustrated with a circular base, other overall shapes may include oval bases, square bases, and rectangular bases, among others.

FIG. 11 is a cross-sectional view of an LED package 48 that is similar to the LED package 18 of FIG. 2 and illustrates an arrangement where the encapsulant 16 provides common encapsulation across all of the zones 1-4. In this manner the same material for the encapsulant 16 may extend across and on the submount 14 and corresponding LED chips 12 in all of the zones 1-4. As described above, the LED chips 12 in each of the zones 1-4 may be configured to emit different peak wavelengths of light that vary broadly across the electromagnetic spectrum from UV to visible to IR. In this manner, light emissions within each of the zones 1-4 may propagate differently and with different efficiencies through the encapsulant 16. For example, the encapsulant 16 may comprise a material with highest transmissivity values in the visible spectrum. In such embodiments, it may be advantageous to position LED chips 12 (e.g., zones 3 and 4 in FIG. 11) with UV and/or IR peak wavelengths that are predominantly outside the visible spectrum closer to perimeter edges of the encapsulant 16 where a shape of the lens 16' may provide increased light extraction. In this manner, the shape of the encapsulant 16 and corresponding lens 16' may be arranged differently for visible light zones such as zones 1 and 2 compared with zones 3 and 4. For example, the lens 16' may form a substantially planar top surface that is registered with zones 1 and 2 and a curved surface for zones 3 and 4.

FIG. 12 is a cross-sectional view of an LED package 50 that is similar to the LED package 48 of FIG. 11 but for embodiments where the encapsulant 16 forms a different lens 16'-1 to 16'-4 for each of the zones 1-4. In this manner, the same material for the encapsulant 16 may be provided across each of the zones 1-4, but with different shapes for at least some of the zones 1-4 based on differences in light transmissive properties of the encapsulant 16 relative to different peak wavelengths provided from the zones 1-4. As with FIG. 11, the encapsulant 16 may comprise a material with highest transmissivity values in the visible spectrum. In certain embodiments, zones 1 and 2 may both comprise LED chips 12 configured to emit various peak wavelengths across the visible spectrum and a shape of each corresponding lens 16'-1, 16'-2 may be the same. For zones 3 and 4, which may provide various peak wavelengths outside the visible spectrum, such as UV for zone 3 and IR for zone 4, the shapes of their corresponding lenses 16'-3, 16'-4 may be different than the lenses 16'-1, 16'-2. In certain embodiments, at least one of the lenses 16'-3, 16'-4 comprises a height that is shorter in a direction measured from the submount 14 than a corresponding height of the lenses 16'-1, 16'-2. In this manner, when the encapsulant 16 is configured with highest light transmissivity in in the visible range, light in the UV and IR zones 3 and 4 may have less distance to travel through the encapsulant 16, thereby reducing light loss. By providing different lenses 16'-1, 16'-2 that are tailored for the peak wavelengths from each of the zones 1-4, the combined emission profile may be directed to a common focal point and/or overlapping far field patterns from each of the zones 1-4, or the combined emission profile may be configured for other unique far field patterns.

FIG. 13 is a cross-sectional view of an LED package 52 that is similar to the LED package 50 of FIG. 12 but for embodiments where each individual LED chip 12 is arranged with a separate lens 16'. By providing a separate lens 16' over each individual LED chip 12, the shape and/or material for each lens 16' may be tailored to the specific peak wavelength of the underlying LED chip 12. Additionally, the submount 14 may be configured with any connection scheme that allows intermixing of different LED chips 12 that provide different peak wavelengths. In this manner, each of the zones 1 to 4 illustrated in FIG. 13 may be interspersed with one another along the submount 14. Exemplary connection schemes that allow such intermixing may include those previously described for FIG. 6 or FIG. 7 and the connection scheme that will be described in greater detail below for FIG. 15.

FIG. 14 is a cross-sectional view of an LED package 54 that is similar to the LED package 50 of FIG. 12 but for embodiments where not all of the LED chips 12 are arranged with a corresponding lens 16'. By providing lenses 16' over certain ones of the LED chips 12 and not others of the LED chips 12, the combined emissions for the LED package 54 may be further tailored to a desired emission profile. For example, zones 1 and zones 2 in FIG. 14 are provided along central portions of the submount 14 and do not include lenses 16'. Without a lens 16', the LED chips 12 in zones 1 and 2 may accordingly emit light with a broader emission spectrum. Zones 3 and 4 are arranged closer to peripheral portions of the submount 14 and include corresponding lenses 16' that serve to shape light from the underlying LED chips 12 toward a desired emission direction. In this manner, an overall emission profile of the LED package 54 may be tailored by placement of lenses 16' and/or the absence of lenses 16'. Such principles are applicable to embodiments where zones 1 to 4 in FIG. 14 may represent any combination of different peak wavelengths and/or forward voltages.

FIG. 15 is a cross-sectional view of an LED package 56 that is similar to the LED package 36 of FIG. 7, but where the submount 14 embodies a multiple layer ceramic substrate that provides separate electrical connections for different ones of the LED chips 12-1 to 12-4. For exemplary purposes, the LED chips 12-1 to 12-4 are arranged in a plurality of Groups 1 to 3, where each Group 1 to 3 corresponds with groupings of the LED chips 12-1 to 12-4 by common forward voltages and/or emission wavelengths. For example, Group 1 includes LED chips 12-1 and 12-2 which may be configured to turn on at a same or similar forward voltage and provide different peak wavelengths. Group 2 with the LED chips 12-3 and Group 3 with the LED chips 12-4 may each be defined by at least one of a different emission wavelength and a different forward voltage. As illustrated, each of the Groups 1 to 3 may be intermixed across the submount 14. For multiple layer ceramic substrate embodiments, the submount 14 may include patterned metal traces 58-1 to 58-3 that alternate with dielectric layers 60-1 to 60-4. Different layers or levels of the patterned metal traces 58-1 to 58-3 may be interconnected through various dielectric layers 60-1 to 60-4 by one or more electrical vias 62 in order to provide separate electrical connections for each of the Groups 1 to 3. In this manner, the submount 14 may serve to route electrical signals to each of the LED chips 12-1 to 12-4 while specific control signals may be generated by an external device that is coupled with the LED package 56. As illustrated, the top patterned metal trace 58-1 may form top contact pads for the LED chips 12-1 to 12-4 at the first face 14' and the bottom patterned metal trace 58-3 may form contact pads for the LED package 56 that electrically connect with an external device, such as a printed circuit board. It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A light-emitting diode (LED) package comprising:
   a submount;
   a plurality of LED chips on the submount, wherein the plurality of LED chips are configured to provide a plurality of peak wavelengths that include at least a first peak wavelength in a range from 100 nanometers (nm) to 400 nm, a second peak wavelength in a range from 400 nm to 750 nm, and a third peak wavelength in a range from 750 nm to 1100 nm; and
   an encapsulant that covers the plurality of LED chips and portions of the submount that are adjacent the plurality of LED chips;
   wherein the plurality of LED chips comprises from 10 to 20 LED chips that are each configured to emit a different peak wavelength of the plurality of peak wavelengths; and
   wherein the peak wavelengths of the 10 to 20 LED chips differ from one another by at least 10 nanometers.

2. The LED package of claim 1, wherein the encapsulant forms a single lens that covers the plurality of LED chips on the submount.

3. The LED package of claim 1, wherein:
   the plurality of LED chips are arranged in a plurality of zones on the submount; and
   each zone is defined by a subgroup of the plurality of LED chips such that a forward turn-on voltage for each LED chip in the zone does not exceed a maximum forward voltage rating for any other LED chip in the zone.

4. The LED package of claim 3, wherein the maximum forward voltage rating in a first zone of the plurality of zones differs from the maximum forward voltage rating in a second zone of the plurality of zones in a range from 0.5 V to 1.5 V.

5. The LED package of claim 3, wherein each zone of the plurality of zones is spatially separated from other zones of the plurality of zones across a surface of the submount.

6. The LED package of claim 3, wherein each zone of the plurality of zones is interspersed with at least one other zone of the plurality of zones across a surface of the submount.

7. The LED package of claim 3, wherein:
   a first zone of the plurality of zones is defined by a first subgroup of the plurality of LED chips having a first maximum forward voltage rating;
   a second zone of the plurality of zones is defined by a second subgroup of the plurality of LED chips having a second maximum forward voltage rating;
   a third zone of the plurality of zones is defined by a third subgroup of the plurality of LED chips having a third maximum forward voltage rating; and
   a fourth zone of the plurality of zones is defined by a fourth subgroup of the plurality of LED chips having a fourth maximum forward voltage rating.

8. The LED package of claim 7, wherein:
   the first maximum forward voltage rating and the second maximum forward voltage rating are within 0.5 V of one another;
   the third maximum forward voltage rating and the fourth maximum forward voltage rating are within 0.5 V of one another; and
   the first maximum forward voltage rating differs from the third maximum forward voltage rating in a range from 0.5 V to 1.5 V.

9. The LED package of claim 3, wherein at least one zone of the plurality of zones comprises:
   a first serial string of LED chips that are configured to emit the first peak wavelength;
   a second serial string of LED chips that are configured to emit the second peak wavelength;
   a third serial string of LED chips that are configured to emit the third peak wavelength; and
   a fourth serial string of LED chips that are configured to emit a fourth peak wavelength, wherein the first peak wavelength, the second peak wavelength, the third peak wavelength, and the fourth peak wavelength differ from one another by at least 10 nm.

10. The LED package of claim 9, wherein a common ground connection is electrically connected to each of the first serial string, the second serial string, the third serial string, and the fourth serial string.

11. The LED package of claim 3, wherein a first zone of the plurality of zones is arranged such that each LED chip within the first zone is capable of being electrically activated and deactivated independently from other LED chips within the first zone.

12. The LED package of claim 11, wherein a second zone of the plurality of zones is arranged with serial strings of the LED chips within the second zone.

13. The LED package of claim 3, wherein at least one zone of the plurality of zones comprises:
a first serial string of LED chips; and
a shunt device that is arranged between each LED chip of the first serial string of LED chips.

14. The LED package of claim 3, wherein the plurality of zones comprise at least a first zone and a second zone, wherein the second zone is arranged to laterally surround a perimeter of the first zone.

15. The LED package of claim 1, wherein the submount comprises an application-specific integrated circuit (ASIC) that is configured to provide control signals to the plurality of LED chips.

16. The LED package of claim 1, wherein the submount comprises a multiple layer ceramic substrate that includes alternating layers of patterned metal traces and dielectric layers.

17. The LED package of claim 1, wherein the encapsulant forms a separate lens for each LED chip of the plurality of LED chips on the submount.

18. A light-emitting diode (LED) package comprising:
a submount;
a plurality of LED chips that are arranged in at least a first zone and a second zone on the submount, wherein:
the first zone is defined by a first subgroup of LED chips of the plurality of LED chips such that the first subgroup of LED chips has a first maximum forward voltage rating; and
the second zone is defined by a second subgroup of LED chips of the plurality of LED chips such that the second subgroup of LED chips has a second maximum forward voltage rating that is different than the first maximum forward voltage rating;
a first encapsulant that covers at least one LED chip of the first subgroup of LED chips in the first zone; and
a second encapsulant that covers at least one LED chip of the second subgroup of LED chips in the second zone, wherein the second encapsulant comprises a different material than the first encapsulant.

19. The LED package of claim 18, wherein the first subgroup of LED chips is configured to emit one or more peak wavelengths in a range from 400 nm to 750 nm, and the second subgroup of LED chips is configured to emit one or more peak wavelengths in at least one of a range from 100 mm to 400 nm and a range from 750 nm to 1100 nm.

20. The LED package of claim 19, wherein the first encapsulant comprise a higher transmissivity to light in the range from 400 nm to 750 nm than at least one of the range from 100 mm to 400 nm and the range from 750 nm to 1100 nm.

21. The LED package of claim 18, wherein the plurality of LED chips are further arranged in at least a third zone and a fourth zone, wherein:
the third zone is defined by a third subgroup of LED chips of the plurality of LED chips such that the third subgroup of LED chips has a third maximum forward voltage rating; and
the fourth zone is defined by a fourth subgroup of LED chips of the plurality of LED chips such that the fourth subgroup of LED chips has a fourth maximum forward voltage rating.

22. The LED package of claim 21, further comprising:
a third encapsulant that covers at least one LED chip of the third subgroup of LED chips in the third zone; and
a fourth encapsulant that covers at least one LED chip of the fourth subgroup of LED chips in the fourth zone, wherein at least one of the third encapsulant and the fourth encapsulant comprises a different material than the first encapsulant.

23. The LED package of claim 22, wherein the first encapsulant, the second encapsulant, the third encapsulant, and the fourth encapsulant are arranged to collectively form an overall lens that covers the plurality of LED chips.

24. The LED package of claim 22, wherein each of the first encapsulant, the second encapsulant, the third encapsulant, and the fourth encapsulant forms a separate lens.

25. The LED package of claim 21, wherein at least one LED chip of the third subgroup of LED chips in the third zone is devoid of a lens.

26. A light-emitting diode (LED) package comprising:
a submount;
a plurality of LED chips on the submount, wherein the plurality of LED chips are configured to provide a plurality of peak wavelengths that include at least a first peak wavelength in a range from 100 nanometers (nm) to 400 nm, a second peak wavelength in a range from 400 nm to 750 nm, and a third peak wavelength in a range from 750 nm to 1100 nm; and
an encapsulant that covers the plurality of LED chips and portions of the submount that are adjacent the plurality of LED chips;
wherein the plurality of LED chips are arranged in a plurality of zones on the submount and each zone is defined by a subgroup of the plurality of LED chips such that a forward turn-on voltage for each LED chip in the zone does not exceed a maximum forward voltage rating for any other LED chip in the zone.

27. The LED package of claim 26, wherein the maximum forward voltage rating in a first zone of the plurality of zones differs from the maximum forward voltage rating in a second zone of the plurality of zones in a range from 0.5 V to 1.5 V.

28. The LED package of claim 26, wherein each zone of the plurality of zones is spatially separated from other zones of the plurality of zones across a surface of the submount.

29. The LED package of claim 26, wherein each zone of the plurality of zones is interspersed with at least one other zone of the plurality of zones across a surface of the submount.

* * * * *